(12) United States Patent
Natori

(10) Patent No.: US 11,309,343 B2
(45) Date of Patent: Apr. 19, 2022

(54) IMAGING ELEMENT, METHOD OF MANUFACTURING IMAGING ELEMENT, AND ELECTRONIC APPARATUS

(71) Applicant: SONY SEMICONDUCTOR SOLUTIONS CORPORATION, Kanagawa (JP)

(72) Inventor: Taichi Natori, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/647,687

(22) PCT Filed: Sep. 14, 2018

(86) PCT No.: PCT/JP2018/034127
§ 371 (c)(1),
(2) Date: Mar. 16, 2020

(87) PCT Pub. No.: WO2019/065295
PCT Pub. Date: Apr. 4, 2019

(65) Prior Publication Data
US 2020/0235141 A1    Jul. 23, 2020

(30) Foreign Application Priority Data

Sep. 29, 2017  (JP) .............................. JP2017-190422

(51) Int. Cl.
*H01L 27/146* (2006.01)
*G02B 5/20* (2006.01)

(52) U.S. Cl.
CPC .......... *H01L 27/1462* (2013.01); *G02B 5/208* (2013.01); *H01L 27/14618* (2013.01); *H01L 27/14685* (2013.01)

(58) Field of Classification Search
CPC ................. H01L 25/167; H01L 31/107; H01L 27/14643–14663; H01L 27/1462;
(Continued)

(56) References Cited

U.S. PATENT DOCUMENTS

2008/0185603 A1* 8/2008 Itoi ................... H01L 27/14618
257/98
2009/0273047 A1* 11/2009 Yamamoto .......... H01L 31/0203
257/432
(Continued)

FOREIGN PATENT DOCUMENTS

JP      H07-022599     1/1995
JP      H09-243814     9/1997
(Continued)

OTHER PUBLICATIONS

International Search Report and Written Opinion prepared by the Japanese Patent Office dated Oct. 31, 2018, for International Application No. PCT/JP2018/034127.

*Primary Examiner* — Jonathan Han
(74) *Attorney, Agent, or Firm* — Sheridan Ross P.C.

(57) ABSTRACT

The present technology relates to an imaging element, a method of manufacturing the imaging element, and an electronic apparatus that make it possible to suppress generation of a void in an infrared cutoff filter layer. The imaging element includes: a light receiving sensor that performs photoelectric conversion of incoming light; a cover glass that protects a top surface side serving as a light incidence surface of the light receiving sensor; a frame that is disposed in an outer peripheral portion between the light receiving sensor and the cover glass, and is formed with use of an inorganic material; and an infrared cutoff filter layer that is formed on an inner side on a same plane as the frame.

(Continued)

The present technology is applicable to, for example, an imaging element having a CSP structure, and the like.

15 Claims, 20 Drawing Sheets

(58) Field of Classification Search
CPC ......... H01L 27/14618; H01L 27/14685; H01L 27/14687; H01L 27/14625; G02B 5/208; G02B 3/0056; G03B 17/12; H04N 5/369
See application file for complete search history.

(56) References Cited

U.S. PATENT DOCUMENTS

| | | | |
|---|---|---|---|
| 2010/0117176 A1* | 5/2010 | Uekawa | H01L 31/02164 257/432 |
| 2012/0205766 A1* | 8/2012 | Takachi | H01L 27/14625 257/432 |
| 2012/0256284 A1* | 10/2012 | Yukawa | H01L 27/14618 257/432 |
| 2013/0181313 A1* | 7/2013 | Nagata | H01L 27/14634 257/433 |
| 2013/0194464 A1* | 8/2013 | Suzuki | H04N 5/2254 348/294 |

FOREIGN PATENT DOCUMENTS

| | | |
|---|---|---|
| JP | 2006-041277 | 2/2006 |
| JP | 2010-165939 | 7/2010 |
| JP | 2013-137337 | 7/2013 |
| JP | 2013-162492 | 8/2013 |
| WO | WO 2017/094537 | 6/2017 |

\* cited by examiner

IMAGING ELEMENT, METHOD OF MANUFACTURING IMAGING ELEMENT, AND ELECTRONIC APPARATUS

CROSS REFERENCE TO RELATED APPLICATIONS

This application is a national stage application under 35 U.S.C. 371 and claims the benefit of PCT Application No. PCT/JP2018/034127 having an international filing date of 14 Sep. 2018, which designated the United States, which PCT application claimed the benefit of Japanese Patent Application No. 2017-190422 filed 29 Sep. 2017, the entire disclosures of each of which are incorporated herein by reference.

TECHNICAL FIELD

The present technology relates to an imaging element, a method of manufacturing the imaging element, and an electronic apparatus, and particularly to an imaging element, a method of manufacturing the imaging element, and an electronic apparatus that make it possible to suppress generation of a void in an infrared cutoff filter layer.

BACKGROUND ART

There is proposed a method of forming an infrared cutoff filer integrally with a solid-state imaging element substrate. For example, PTL 1 discloses a camera module in which an infrared cutoff filter is provided on a planarized film that is formed on a top face of an on-chip lens of a solid-state imaging element substrate, and a glass substrate is disposed on the infrared cutoff filter.

CITATION LIST

Patent Literature

PTL 1: Japanese Unexamined Patent Application Publication No. 2013-137337

SUMMARY OF THE INVENTION

Problems to be Solved by the Invention

However, in a configuration of the PTL 1, there is no adhesive agent between the infrared cutoff filter and the glass substrate, and the glass substrate is bonded after curing the infrared cutoff filter formed by spin coating. As a result, a void (a clearance gap) is likely to be generated between the infrared cutoff filter and the glass substrate, which potentially causes occurrence of deterioration in optical characteristics and any image defect.

The present technology has been made in light of such circumstances, and is intended to make it possible to suppress generation of a void in the infrared cutoff filter layer.

Means for Solving the Problems

An imaging element according to a first aspect of the present technology includes: a light receiving sensor that performs photoelectric conversion of incoming light; a protective substrate that protects a top surface side sewing as a light incidence surface of the light receiving sensor; a frame that is disposed in an outer peripheral portion between the light receiving sensor and the protective substrate, and is formed with use of an inorganic material; and an infrared cutoff filter layer that is formed on an inner side on a same plane as the frame.

A method of manufacturing an imaging element according to a second aspect of the present technology includes: forming a frame at a position of an outer peripheral portion of a light receiving sensor on a protective substrate that protects the light receiving sensor, the frame being formed with use of an inorganic material; forming an infrared cutoff filter layer on an inner side on a same plane as the frame; and bonding the frame and the infrared cutoff filter layer that are formed on the same plane to the light receiving sensor by an adhesive agent.

In the second aspect of the present technology, the frame that is formed with use of an inorganic material is formed at the position of the outer peripheral portion of the light receiving sensor on the protective substrate that protects the light receiving sensor; the infrared cutoff filter layer is formed on the inner side on the same plane as the frame; and the frame and the infrared cutoff filter layer that are formed on the same plane are bonded to the light receiving sensor by the adhesive agent.

An electronic apparatus according to a third aspect of the present technology is provided with an imaging element that includes: a light receiving sensor that performs photoelectric conversion of incoming light; a protective substrate that protects a top surface side serving as a light incidence surface of the light receiving sensor; a frame that is disposed in an outer peripheral portion between the light receiving sensor and the protective substrate, and is formed with use of an inorganic material; and an infrared cutoff filter layer that is formed on an inner side on a same plane as the frame.

In the first and third aspects of the present technology, in the imaging element is provided with the light receiving sensor that performs photoelectric conversion of incoming light; the protective substrate that protects the top surface side serving as the light incidence surface of the light receiving sensor; the frame that is disposed in the outer peripheral portion between the light receiving sensor and the protective substrate, and is formed with use of the inorganic material; and the infrared cutoff filter layer that is formed on the inner side on the same plane as the frame.

The imaging element and the electronic apparatus may be independent apparatuses or modules to be incorporated into another apparatus.

Effects of the Invention

According to the first to third aspects of the present technology, it is possible to suppress generation of a void in the infrared cutoff filter layer.

It is to be noted that the effects described here are not necessarily limitative, but may be any of effects described in the present disclosure.

MODES FOR CARRYING OUT THE INVENTION

Hereinafter, embodiments of the present technology (hereinafter referred to as embodiments) are described. It is to be noted that description is given in the following order.
1. Cross-Sectional View of Imaging Element
2. Method of Manufacturing Imaging Element
3. Modification Examples of Imaging Element
4. Detailed Configuration Examples of Light Receiving Sensor
5. Example of Application to Electronic Apparatus
6. Usage Examples of Image Sensor
7. Example of Application to In Vivo Information Acquisition System
8. Example of Application to Endoscopic Surgical System
9. Example of Application to Mobile Body

1. CROSS-SECTIONAL VIEW OF IMAGING ELEMENT

Figure 1:
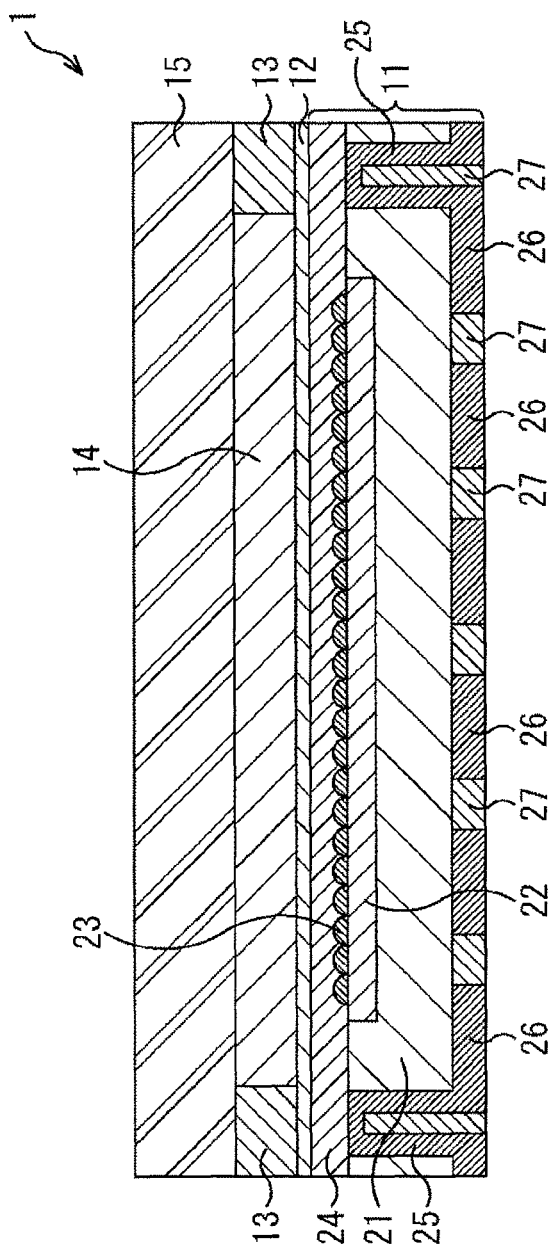
FIG. 1 is a cross-sectional view of a simplified configuration of an imaging element to which the present technology is applied.

FIG. 1 is a cross-sectional view of an imaging element as an embodiment to which the present technology is applied.

An imaging element 1 illustrated in FIG. 1 has a CSP (Chip Size Package) structure that includes a light receiving sensor 11 having a chip size and a cover glass 15 protecting a top surface side as a light incidence surface of the light receiving sensor 11. The light receiving sensor 11 generates and outputs an imaging signal by performing photoelectric conversion of incoming light. In FIG. 1, light enters in a downward direction from an upper side of the cover glass 15 to be received by the light receiving sensor 11.

A frame 13 is bonded at a position of an outer peripheral portion of a bottom surface on the light receiving sensor 11 side of the cover glass 15, and an infrared cutoff filter layer (hereinafter referred to as an IRCF filter) 14 is formed with the same thickness as that of the frame 13 on an inner side in a planar direction of the frame 13. The frame 13 is formed with use of an inorganic material such as glass and silicon, for example. The IRCF layer 14 is formed with use of, for example, a curable resin composition material.

Meanwhile, in the light receiving sensor 11, a light receiving region 22 is formed on a surface on the cover glass 15 side that is a top surface of a semiconductor substrate 21 that is configured using a silicon substrate or the like. In the light receiving region 22, pixels each of which includes a photoelectric conversion device such as a photodiode, a plurality of pixel transistors, and the like are disposed two-dimensionally in a matrix pattern, and a color filter (not illustrated) of, for example, R (red), G (green), or B (blue), and an on-chip lens 23 are disposed for each pixel on a top surface of the light receiving region 22. A planarizing film 24 is disposed on an upper side of the on-chip lens 23. The planarizing film 24 formed in an uppermost portion of the light receiving sensor 11 is bonded to bottom surfaces of the frame 13 and the IRCF layer 14 that are disposed on the same plane over an entire opposed region by an adhesive agent 12.

An imaging signal generated in the light receiving region 22 of the light receiving sensor 11 is outputted from a through electrode 25 penetrating the semiconductor substrate 21, and a rewiring line 26 disposed on a bottom surface of the semiconductor substrate 21. A region on the bottom surface of the semiconductor substrate 21 other than a terminal section that includes the through electrode 25 and the rewiring line 26 is covered with a solder resist 27.

The terminal section that includes the through electrode 25 and the rewiring line 26 of the light receiving sensor 11 is coupled to a main substrate, or an interposer substrate on which the imaging element 1 is mounted with use of a solder ball or the like.

The imaging element 1 configured as described above is a chip-size package (CSP) with a cavityless structure in which there is no void in the frame 13, the IRCF layer 14, the planarizing film 24, and the like between the cover glass 15 that protects the light incidence surface (the top surface) of the light receiving sensor 11 and the light receiving sensor 11.

In the imaging element 1, the frame 13 is disposed between the cover glass 15 that protects the light incidence surface of the light receiving sensor 11 and the light receiving sensor 11, and the inner side in the planar direction of the frame 13 is filled with the IRCF layer 14. Accordingly, the IRCF layer 14 is surrounded by the frame 13 including the inorganic material, which achieves a moisture blocking effect, resulting in improved reliability of the IRCF layer 14. Further, presence of the frame 13 including the inorganic material makes it possible to enhance substrate rigidity and suppress warpage of an entire package.

It is to be noted that, in the present embodiment, description is provided on an example of using the cover glass 15 as a protective substrate that protects the light receiving sensor 11; however, for example, a light transmissive resin substrate may be used instead of the cover glass 15.

2. METHOD OF MANUFACTURING IMAGING ELEMENT

Next, a method of manufacturing the imaging element 1 illustrated in FIG. 1 is described with reference to FIG. 2 to FIG. 4.

Figure 2:
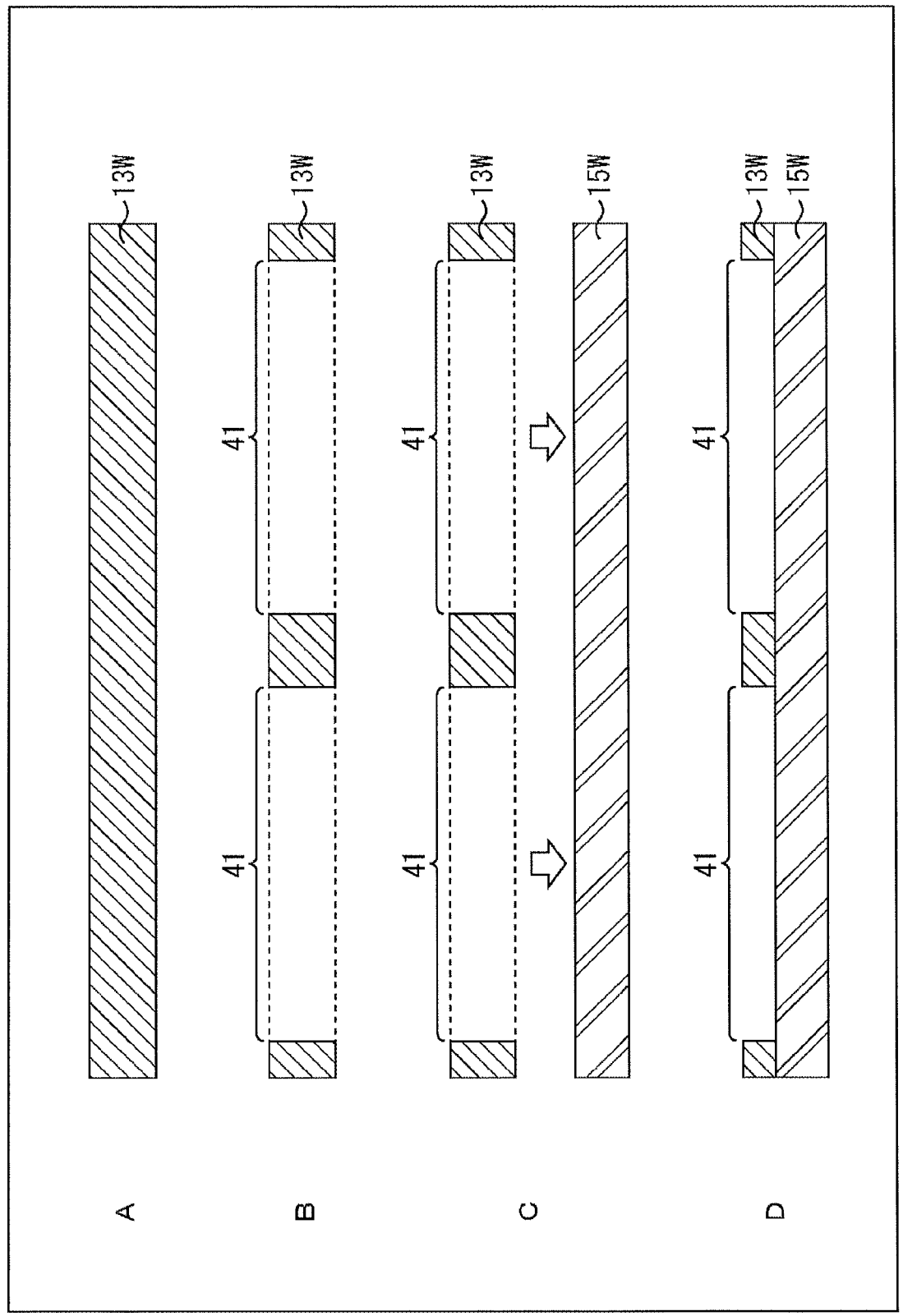
FIG. 2 is a diagram for describing a method of manufacturing an imaging apparatus illustrated in FIG. 1.

First, as illustrated in A of FIG. 2, a wafer-state frame substrate 13W that is used as a material of the frame 13 is prepared. For a material of the wafer-state frame substrate 13W, for example, an inorganic material such as glass and silicon is used as described above. It is to be noted that, in the present specification and the drawings, any component denoted by adding "W" to a reference numeral such as the frame substrate 13W is a component in a wafer state.

For such a wafer-state frame substrate 13W, as illustrated in B of FIG. 2, a through-hole (an opening) 41 is formed at each location serving as a region to be filled with the IRCF layer 14 in configuring the imaging element 1. For formation of the through-hole 41, it is possible to adopt any processing method, such as laser processing, sandblasting, and wet etching. The through-hole 41 is formed not to block light entering the light receiving region 22 of the light receiving sensor 11, and a planer shape of the through-hole 41 may be rectangular or circular, or may be polygonal such as an octagon. The frame substrate 13W remaining after formation of the through-hole 41 is diced in a subsequent process, resulting in formation of the frame 13.

Next, as illustrated in C of FIG. 2, the wafer-state frame substrate 13W in which a plurality of the through-holes 41 is formed, and a wafer-state glass substrate 15W are bonded to each other. For bonding the wafer-state frame substrate 13W and the wafer-state glass substrate 15W, direct bonding is adoptable in addition to bonding using an adhesive agent (an adhesive resin).

Here, description is provided on the direct bonding. A silicon oxide film or a silicon nitride film is formed as a front surface layer on each of surfaces of two substrates to be bonded, and a hydroxyl group is bound to each of such front surface layers. Thereafter, the two substrates are bonded to each other, and are heated and dehydration-condensed. As a result, a silicon-oxygen covalent bond is formed between the front surface layers of the two substrates. This leads to direct bonding of the two substrates. It is to be noted that, as a result of condensation, elements contained in the two front surface layers are also likely to form a direct covalent bond.

In the present specification, as described above, fixing the two substrates with an inorganic material layer interposed between the two substrates; fixing the two substrates by chemically binding inorganic material layers disposed on respective front surfaces of the two substrates; fixing the two substrates by forming a bond resulting from dehydration condensation between inorganic material layers disposed on the respective front surfaces of the two substrates; fixing the two substrates by forming an oxygen-mediated covalent bond or a covalent bond of elements contained in each of inorganic material layers between the inorganic material layers disposed on the respective front surfaces of the two substrates; or fixing the two substrates by forming a silicon-oxygen covalent bond or a silicon-silicon covalent bond between silicon oxide layers or between silicon nitride layers that are disposed on the respective front surfaces of the two substrates is called the direct bonding. In a case where the two substrates are bonded using the direct bonding, it is possible to suppress deformation caused cure shrinkage of a resin over an entire substrate, or deformation caused by thermal expansion of a resin during actual use that occurs in a case where the two substrates are bonded with use of an adhesive resin.

Next, as illustrated in D of FIG. 2, the frame substrate 13W of the wafer-state frame substrate 13W and the wafer-state glass substrate 15W that have been bonded to each other, is ground using a grinder or the like to adjust a thickness of the frame substrate 13W to a desired thickness. In a case where a material of the frame substrate 13W is silicon, the thickness may be adjusted using CMP (Chemical Mechanical Polishing).

Figure 3:
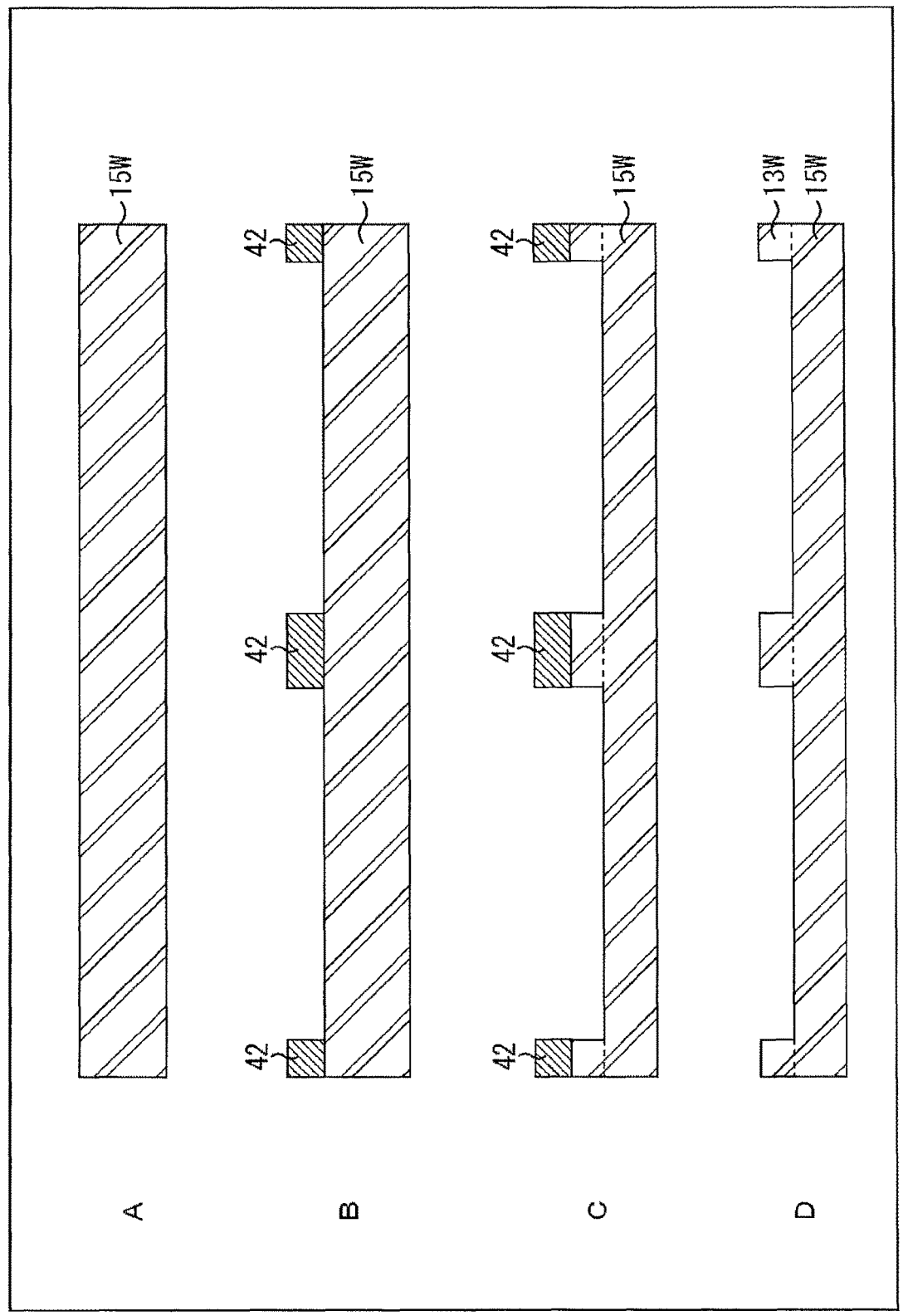
FIG. 3 is a diagram for describing the method of manufacturing the imaging apparatus illustrated in FIG. 1.

The above-described processes illustrated in A to D of FIG. 2 are processes that are adoptable in any case where a material of the wafer-state frame substrate 13W is either glass or silicon; however, a method illustrated in A to D of FIG. 3 is also adoptable in a case where the material of the wafer-state frame substrate 13W is glass.

In other words, A to D of FIG. 3 illustrate manufacturing processes that are adoptable in a case where both of the frame 13 and the cover glass 15 include glass. First, as illustrated in A of FIG. 3, the wafer-state glass substrate 15W is prepared that has a thickness of a total value or more of a thickness of the frame 13 and a thickness of the cover glass 15 at the time of completion of the imaging element 1.

Subsequently, as illustrated in B of FIG. 3, a resist 42 is patterned in a predetermined region on the wafer-state glass substrate 15W. A region in which the resist 42 is not formed on the glass substrate 15W corresponds to a location serving as a region filled with the IRCF layer 14 at the time of completion of the imaging element 1.

As illustrated in C of FIG. 3, the wafer-state glass substrate 15W is etched to a desired thickness by dry etching using the resist 42 as a musk.

Finally, the resist 42 is peeled off, resulting in completion of the same state as a state illustrated in D of FIG. 2. After the resist 42 is peeled off, a thickness of a portion corresponding to the frame substrate 13W in FIG. 2 may be adjusted.

Figure 4:
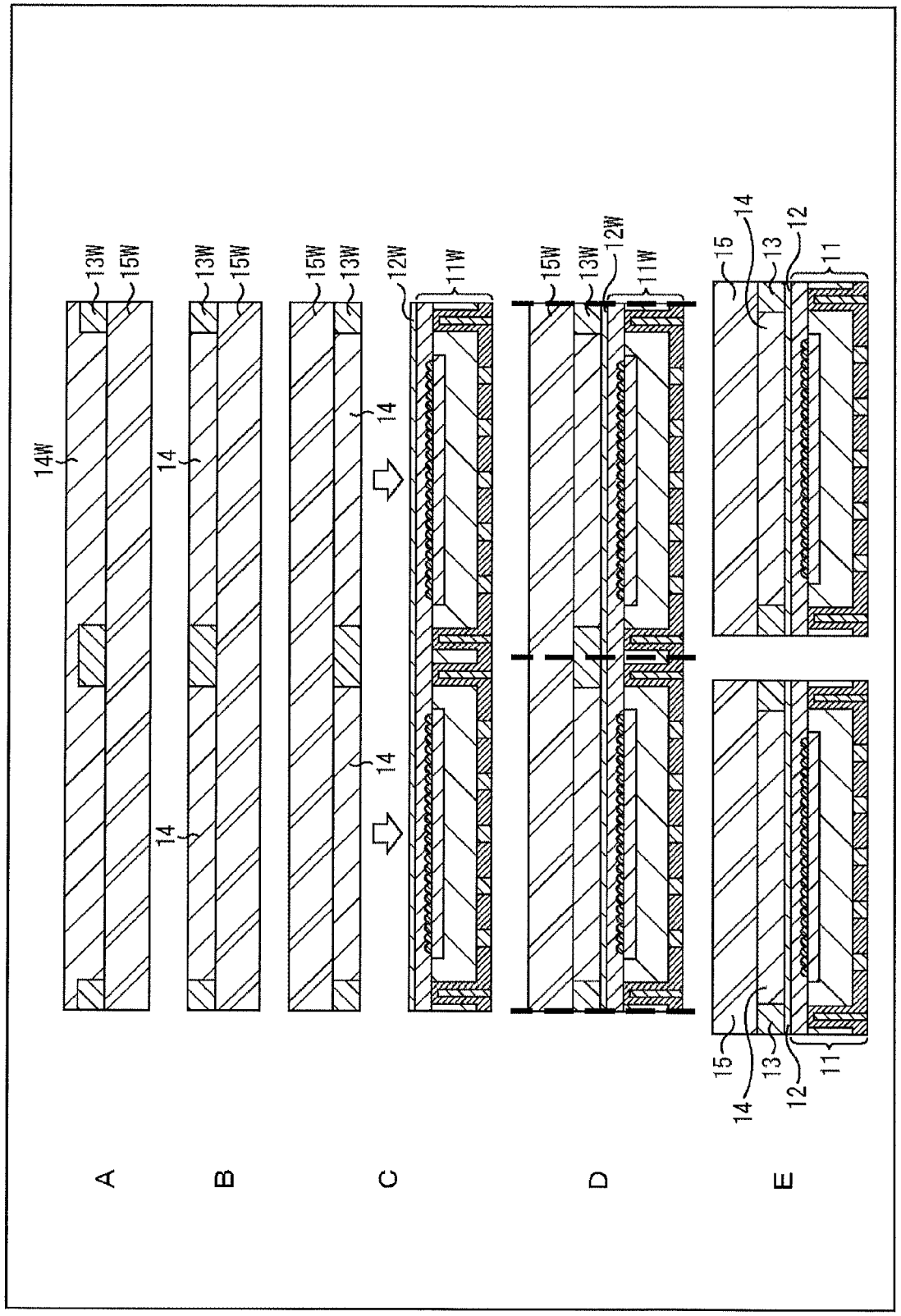
FIG. 4 is a diagram for describing the method of manufacturing the imaging apparatus illustrated in FIG. 1.

After formation is finished until a stage of a state in D of FIG. 2 or D of FIG. 3, as illustrated in A of FIG. 4, a resin material 14W of the IRCF layer 14 is applied onto the glass substrate 15W to which the frame substrate 13W is bonded with use of a predetermined method, such as an ink jet method, a dispense method, a slit coating method, and a spin coating method. At this time, a thickness of the applied resin material 14W is greater than a thickness of the frame substrate 13W (is higher than the frame substrate 13W).

Subsequently, as illustrated in B of FIG. 4, a portion of the resin material 14W that is formed with a thickness greater than a height of the glass substrate 15W is polished and planarized using the CMP, resulting in a state in which the IRCF layer 14 is embedded in the glass substrate 15W.

It is to be noted that, in a case where the ink jet method or the dispense method is used, the resin material 14W may be applied in the frame substrate 13W on the glass substrate 15W to cause a thickness of the resin material 14W to be formed to become equal to a height of the frame substrate 13W. In such a case, it is possible to omit a process of the CMP in B of FIG. 4, which makes it easier to form the IRCF layer 14.

Next, as illustrated in C of FIG. 4, the wafer-state glass substrate 15W to which the frame substrate 13W is bonded is flipped upside down to bond, with an adhesive agent 12W, top surfaces of the frame substrate 13W and the IRCF layer 14 (a surface on the lower side in C of FIG. 4) and a wafer-state light receiving sensor substrate 11W that is fabricated in another process.

Subsequently, along a scribe line indicated with a dashed line in D of FIG. 4, the wafer-state light receiving sensor substrate 11W and the glass substrate 15W that are bonded to each other are diced, resulting in completion of the imaging element 1 illustrated in FIG. 1 as illustrated in E of FIG. 4.

Figure 5:
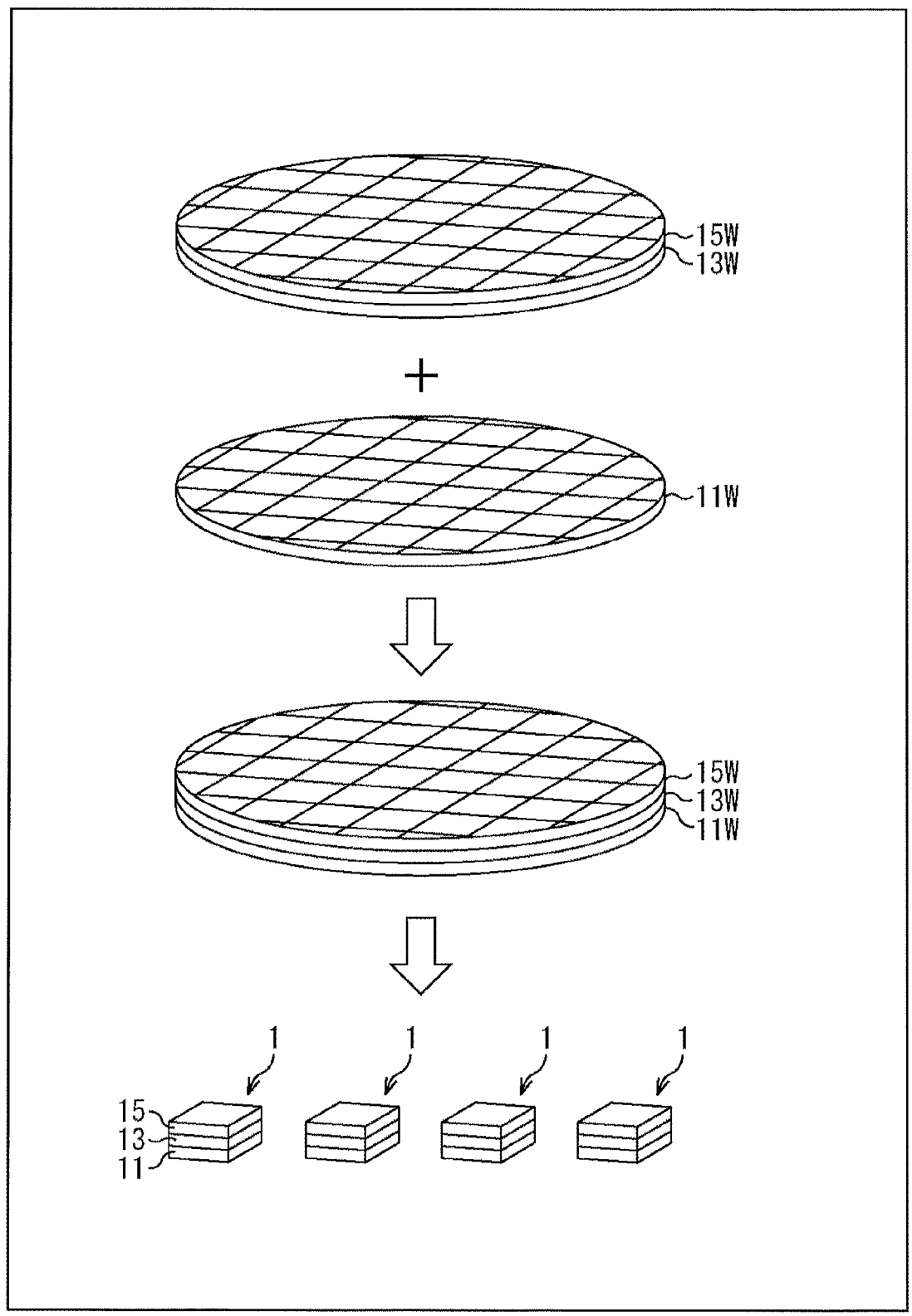
FIG. 5 is a diagram for further describing the manufacturing method described with reference to FIG. 2 to FIG. 4.

The method of manufacturing the imaging element 1 that is described with reference to FIG. 2 to FIG. 4 is a method of bonding the wafer-state glass substrate 15W to which the frame substrate 13W is bonded and the wafer-state light receiving sensor substrate 11W to each other, and thereafter dicing in a chip size, as illustrated in FIG. 5.

As described above, in addition to a manufacturing method in which both the glass substrate 15W to which the frame substrate 13W is bonded and the wafer-state light receiving sensor substrate 11W are fabricated in a wafer state, and thereafter are bond together, it is also possible to fabricate the imaging element 1 by a manufacturing method in which one or both of these substrates are diced in the chip size, and thereafter are bonded together.

Figure 6:
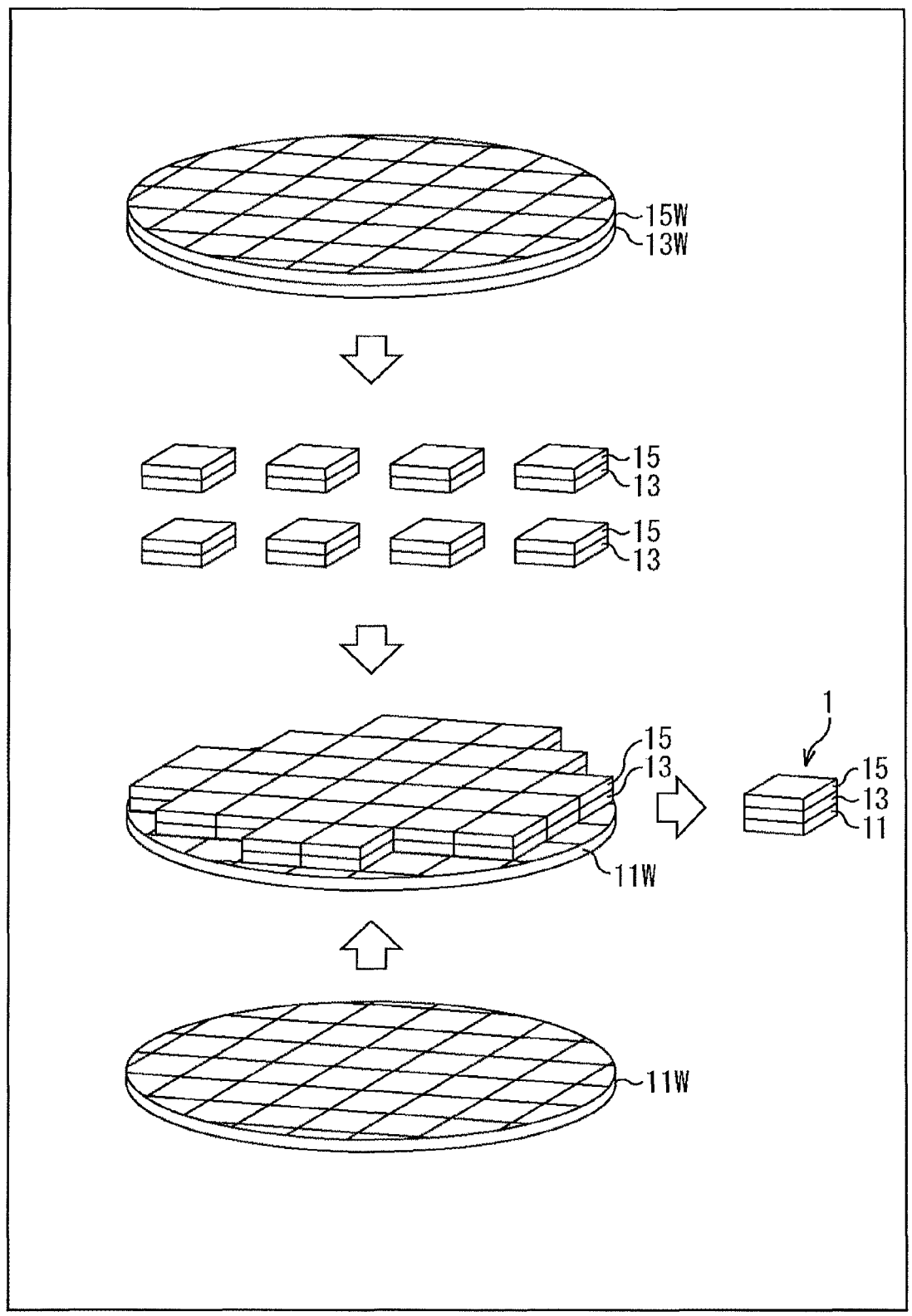
FIG. 6 is a diagram for describing another method of manufacturing the imaging apparatus illustrated in FIG. 1.

More specifically, as illustrated in FIG. 6, it is also possible to adopt a manufacturing method in which the wafer-state glass substrate 15W to which the frame substrate 13W is bonded is diced in the chip size, the cover glass 15 with the frame 13 formed by such dicing is bonded to the wafer-state light receiving sensor substrate 11W, and the wafer-state light receiving sensor substrate 11W to which the cover glass 15 is bonded is diced.

Figure 7:
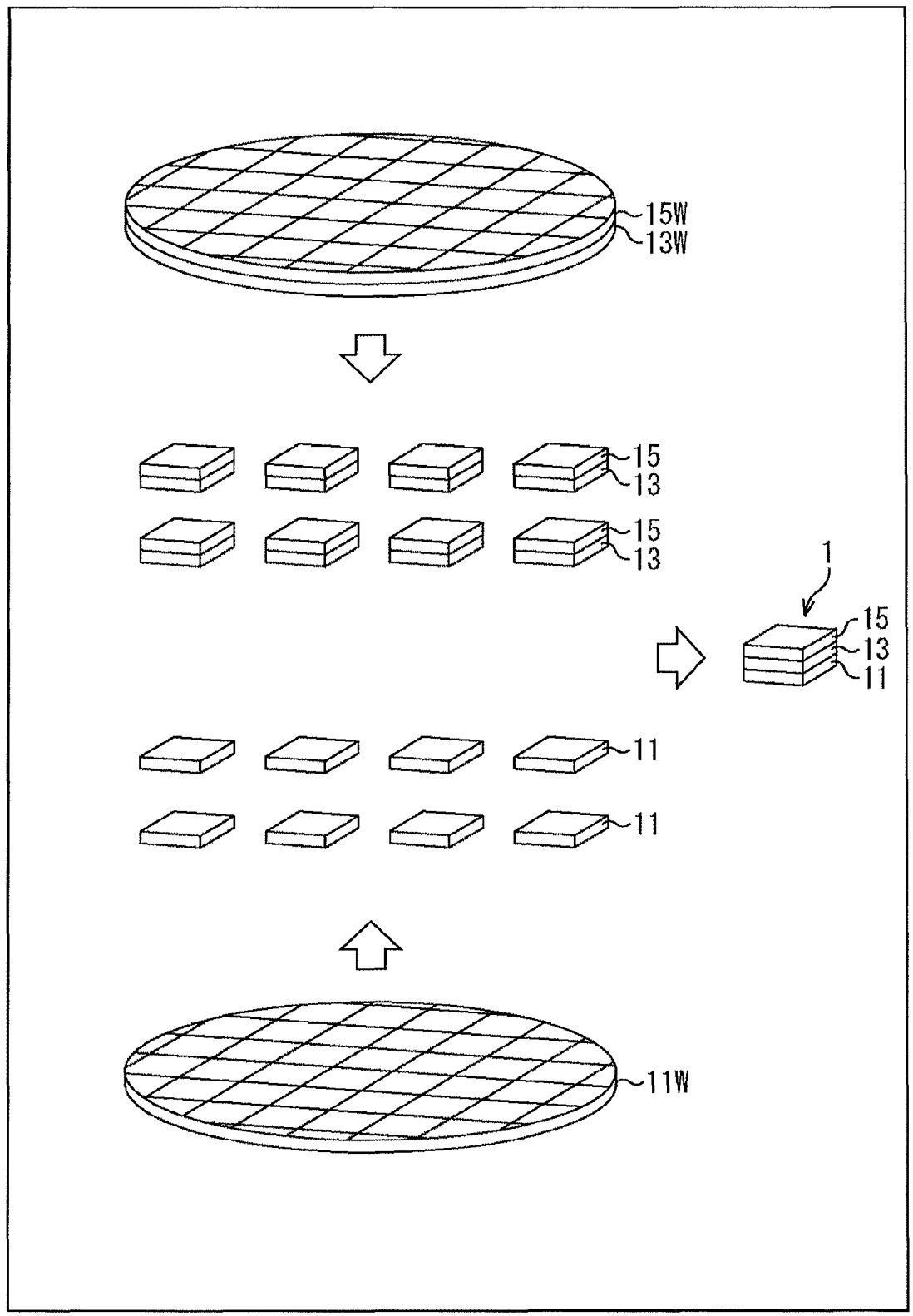
FIG. 7 is a diagram for describing still another method of manufacturing the imaging apparatus illustrated in FIG. 1.

As an alternative, as illustrated in FIG. 7, the wafer-state glass substrate 15W to which the frame substrate 13W is bonded is diced in the chip size, and the wafer-state light receiving sensor substrate 11W is also diced in the chip size. Subsequently, the cover glass 15 with the frame 13 that is diced and the wafer-state light receiving sensor substrate 11W is diced are bonded together. Such a method of manufacturing the imaging element 1 is also adoptable.

According to the methods of manufacturing the imaging element 1 as described above, the cover glass 15 with the frame 13 and the light receiving sensor 11 are bonded to each other with use of the adhesive agent 12, and the adhesive agent 12 is applied onto an entire top surface of the light receiving sensor 11. Therefore, no void (clearance gap) is generated therein, which avoids occurrence of deterioration in optical characteristics and any image defect. Further, it is possible to apply the adhesive agent 12 onto the entire surface in a wafer state, which makes it possible to form the imaging element 1 easily with use of a wafer process such as spin coating.

Further, according to the methods of manufacturing the imaging element 1, as described above, patterning of the IRCF layer 14 is unnecessary, which makes it easy to form the IRCF layer 14.

In addition, according to a configuration of the imaging element 1, a scribe line to be used in dicing the wafer-state light receiving sensor substrate 11W and the wafer-state glass substrate 15W that are bonded to each other corresponds to a location where the frame 13, the cover glass 15, and the semiconductor substrate 21 are stacked, and an inorganic material layer with a certain amount of hardness is provided at such a location, which makes it easy to dice such a layer.

3. MODIFICATION EXAMPLES OF IMAGING ELEMENT

Figure 8:
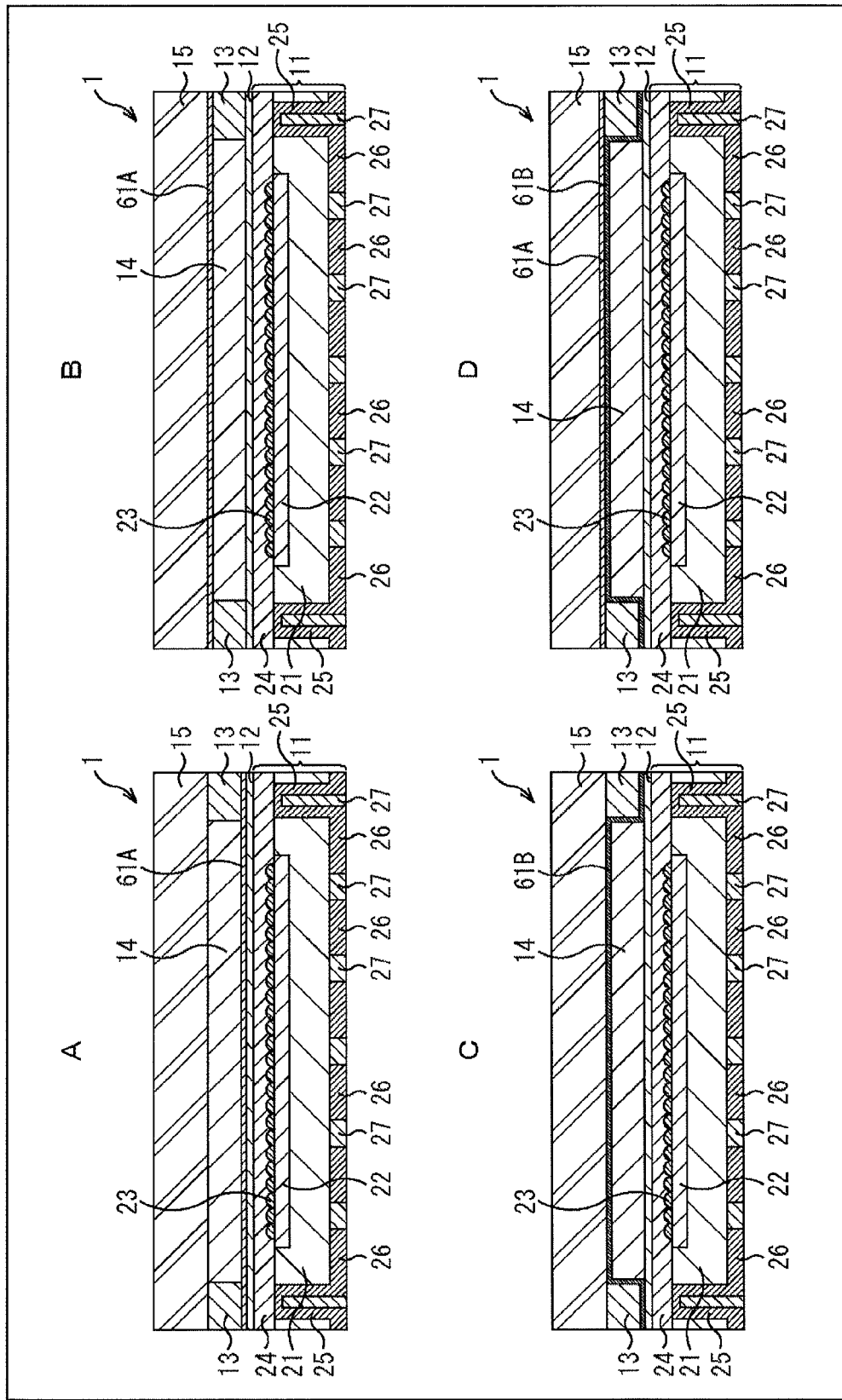
FIG. 8 is a diagram illustrating modification examples of the imaging apparatus illustrated in FIG. 1.

FIG. 8 illustrates modification examples of the imaging element 1.

In the imaging element 1 illustrated in FIG. 1, it is possible to form a low-reflection film (an antireflective film) that reduces reflection of incoming light at a predetermined location of a portion including the frame 13, the IRCF layer 14, and the cover glass 15 as a target to be bonded to the light receiving sensor 11 with use of the adhesive agent 12. A to D of FIG. 8 illustrate a plurality of examples in which the low-reflection film is provided in the imaging element 1.

A of FIG. 8 illustrates an example of the imaging element 1 in which a low-reflection film 61A is formed between the frame 13 and the IRCF layer 14 that are formed on the same plane and the adhesive agent 12. The low-reflection film 61A is formed on top surfaces of the frame 13 and the IRCF layer 14 before the frame 13 and the IRCF layer 14 are bonded to the light receiving sensor 11 with use of the adhesive agent 12, for example.

B of FIG. 8 illustrates an example of the imaging element 1 in which the low-reflection film 61A is formed between the frame 13 and the IRCF layer 14 that are formed on the same plane and the cover glass 15. The low-reflection film 61A is formed on a top surface of the cover glass 15 before the frame 13 and the cover glass 15 are bonded to each other, for example.

C of FIG. 8 illustrates an example of the imaging element 1 in which, a low-reflection film 61B is foil led in a layer between the frame 13 and the adhesive agent 12 in a region where the frame 13 out of the frame 13 and the IRCF layer 14 that form the same plane is formed, and the low-reflection film 61B is formed in a layer between the IRCF layer 14 and the cover glass 15 in a region where the IRCF layer 14 out of the frame 13 and the IRCF layer 14 is formed. The low-reflection film 61B is formed on top surfaces of the frame 13 and the cover glass 15 before the IRCF layer 14 is embedded, for example.

D of FIG. 8 illustrates an example of the imaging element 1 in which both the low-reflection film 61A in B of FIG. 8 and the low-reflection film 61B in C of FIG. 8 are formed. In such a case, each of the low-reflection films 61A and 61B may include a function of a low-reflection film, or a stacked structure of the low-reflection films 61A and 61B may achieve the function of the low-reflection film.

It is possible to configure each of the low-reflection films 61A and 61B by alternatively stacking a plurality of low-refraction films and a plurality of high-refraction films. The low-refraction films include, for example, an oxide film, such as $SiO_x$ (1≤x≤2), SiOC, and SiOF, and the high-refraction films include, for example, a metallic oxide film, such as TiO, TaO, and Nb2O5. As a matter of course, each of the low-reflection films 61A and 61B may be a single-layer film that includes an oxide, a nitride, or any other insulating material.

Alternatively, for materials of the low-reflection films 61A and 61B, it is also possible to use a resin-based materials, such as a styrene-based resin, an acrylic resin, a styrene-acrylic copolymer-based resin, or a siloxane-based resin.

4. DETAILED CONFIGURATION EXAMPLES OF LIGHT RECEIVING SENSOR

As the above-described light receiving sensor 11, it is possible to apply a non-stacked solid-state imaging apparatus, and a stacked solid-state imaging apparatus configured by stacking a plurality of substrates, as described below.

Figure 9:
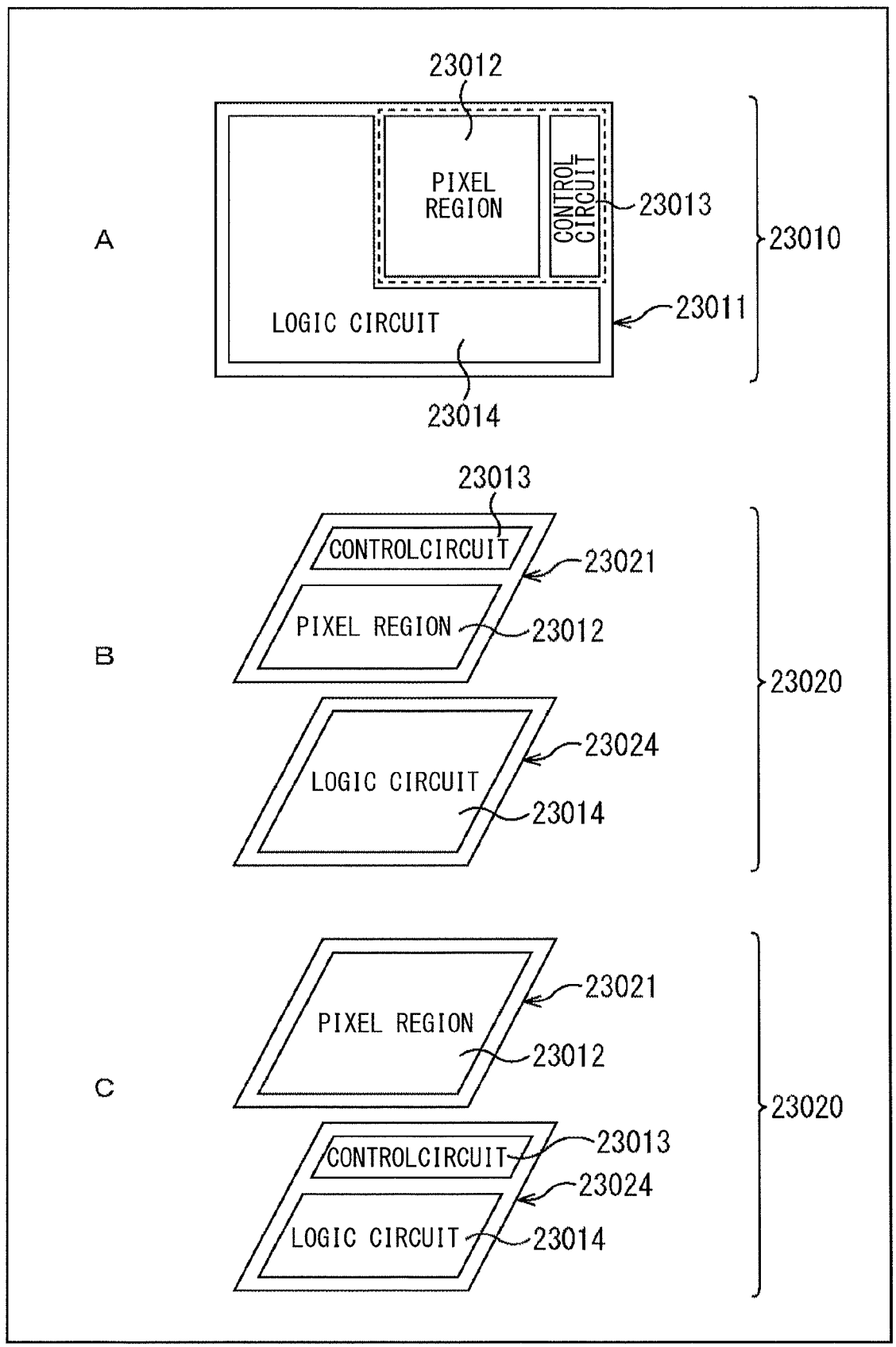
FIG. 9 is a diagram illustrating an overview of configuration examples of a stacked imaging element that is applicable as a light receiving sensor in the imaging apparatus illustrated in FIG. 1.

FIG. 9 is a diagram illustrating an overview of configuration examples of a solid-state imaging apparatus that is applicable as the light receiving sensor 11.

A of FIG. 9 illustrates a simplified configuration example of a non-stacked solid-state imaging apparatus. As illustrated in A of FIG. 9, a solid-state imaging apparatus 23010 has one die (a semiconductor substrate) 23011. The one die 23011 includes a pixel region 23012 in which pixels are disposed in an array, a control circuit 23013 that performs various types of control of pixel driving and any other operation, and a logic circuit 23014 for signal processing.

Each of B and C of FIG. 9 illustrates a simplified configuration example of a stacked solid-state imaging apparatus. As illustrated in B and C of FIG. 9, in a solid-state imaging apparatus 23020, two dies, that is, a sensor die 23021 and a logic die 23024 are stacked and coupled electrically to configure one semiconductor chip.

In B of FIG. 9, the pixel region 23012 and the control circuit 23013 are mounted on the sensor die 23021, and the logic circuit 23014 including a signal processing circuit that performs signal processing are mounted on the logic die 23024.

In C of FIG. 9, the pixel region 23012 is mounted on the sensor die 23021, and the control circuit 23013 and the logic circuit 23014 are mounted on the logic die 23024.

Figure 10:
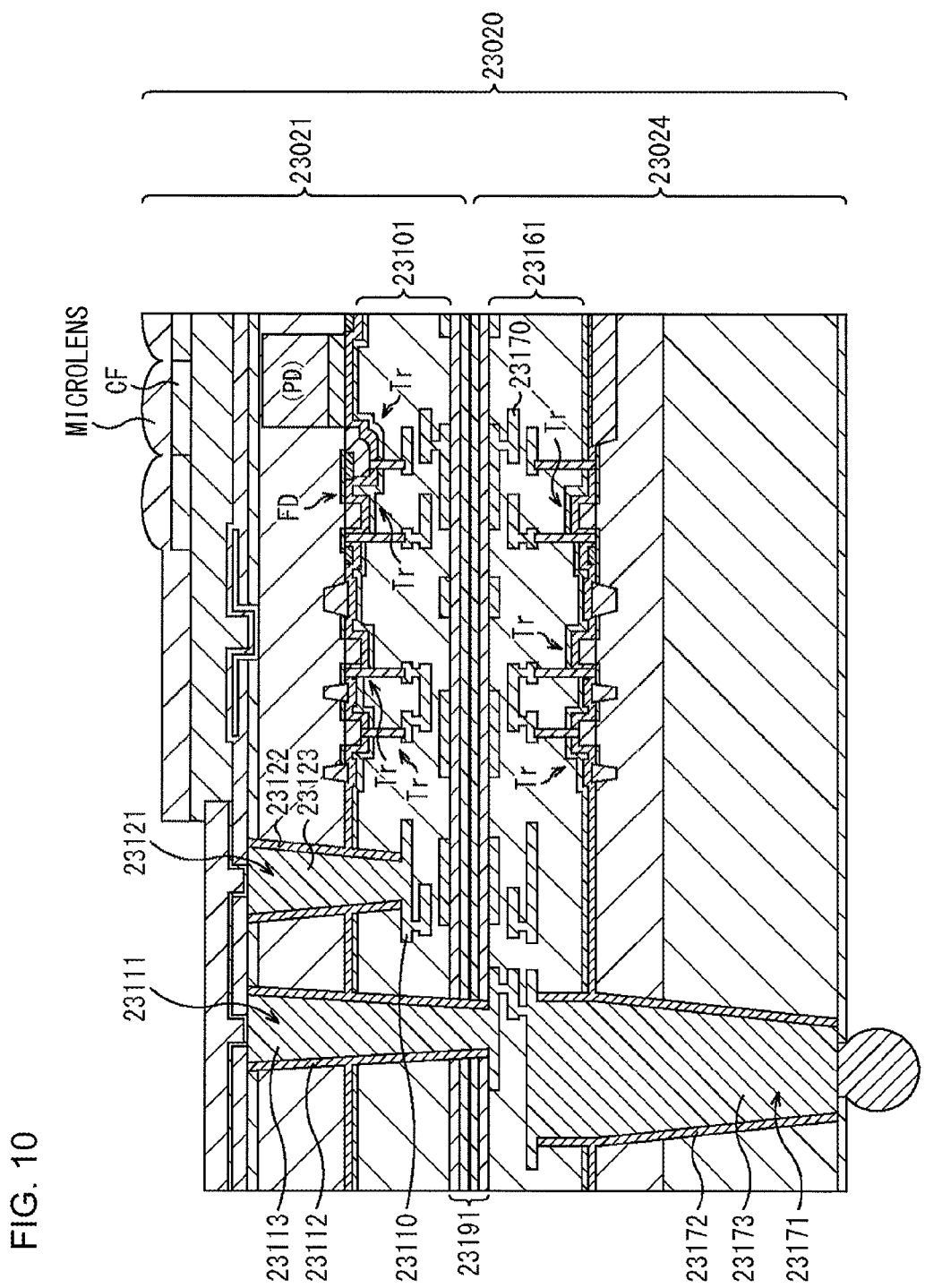
FIG. 10 is a cross-sectional view of a first configuration example of a stacked solid-state imaging apparatus 23020.

FIG. 10 is a cross-sectional view of a first configuration example of the stacked sold-state imaging apparatus 23020.

A PD (photodiode) that configures each of pixels serving as the pixel region 23012, an FD (floating diffusion), a Tr (MOS FET), a Tr serving as the control circuit 23013, and the like are formed in the sensor die 23021. Further, a wiring line layer 23101 having a wiring line 23110 including a plurality of layers is formed in the sensor die 23021. In this example, the wiring line 23110 includes three layers. It is to be noted that the control circuit 23013 (the Tr serving as the control circuit 23013) may be included in the logic die 23024 instead of the sensor die 23021.

A Tr included in the logic circuit 23014 is formed in the logic die 23024. Further, a wiring line layer 23161 having a wiring line 23170 including a plurality of layers is formed in the logic die 23024. In this example, the wiring lines includes three layers. In addition, a contact hole 23171 having an insulating film 23172 formed on an inner wall surface thereof is formed in the logic die 23024, and an interconnecting conductor 23173 to be coupled to the wiring line 23170 and the like is embedded in the contact hole 23171.

The sensor die 23021 and the logic die 23024 are bonded together with the respective wiring line layers 23101 and 23161 opposed to each other, thereby forming the stacked solid-state imaging apparatus 23020 in which the sensor die 23021 and the logic die 23024 are stacked. A film 23191 such as a protective film is formed on a bonding surface between the sensor die 23021 and the logic die 23024.

A contact hole 23111 is formed in the sensor die 23021. The contact hole 23111 penetrates the sensor die 23021 from a back surface side (side where light enters the PD) (upper side) of the sensor die 23021 and reaches the wiring line 23170 in the uppermost layer of the logic die 23024. Furthermore, a contact hole 23121 is formed in the sensor die 23021. The contact hole 23121 is located adjacent to the contact hole 23111 and reaches the wiring line 23110 in the first layer from the back surface side of the sensor die 23021. An insulating film 23112 is formed on an inner wall surface of the contact hole 23111, and an insulating film 23122 is formed on an inner wall surface of the contact hole 23121. Subsequently, interconnecting conductors 23113 and 23123 are respectively embedded in the contact holes 23111 and 23121. The interconnecting conductor 23113 and the interconnecting conductor 23123 are electrically coupled to each other on the back surface side of the sensor die 23021, and thus the sensor die 23021 and the logic die 23024 are electrically coupled to each other through the wiring line layer 23101, the contact hole 23121, the contact hole 23111, and the wiring line layer 23161.

Figure 11:
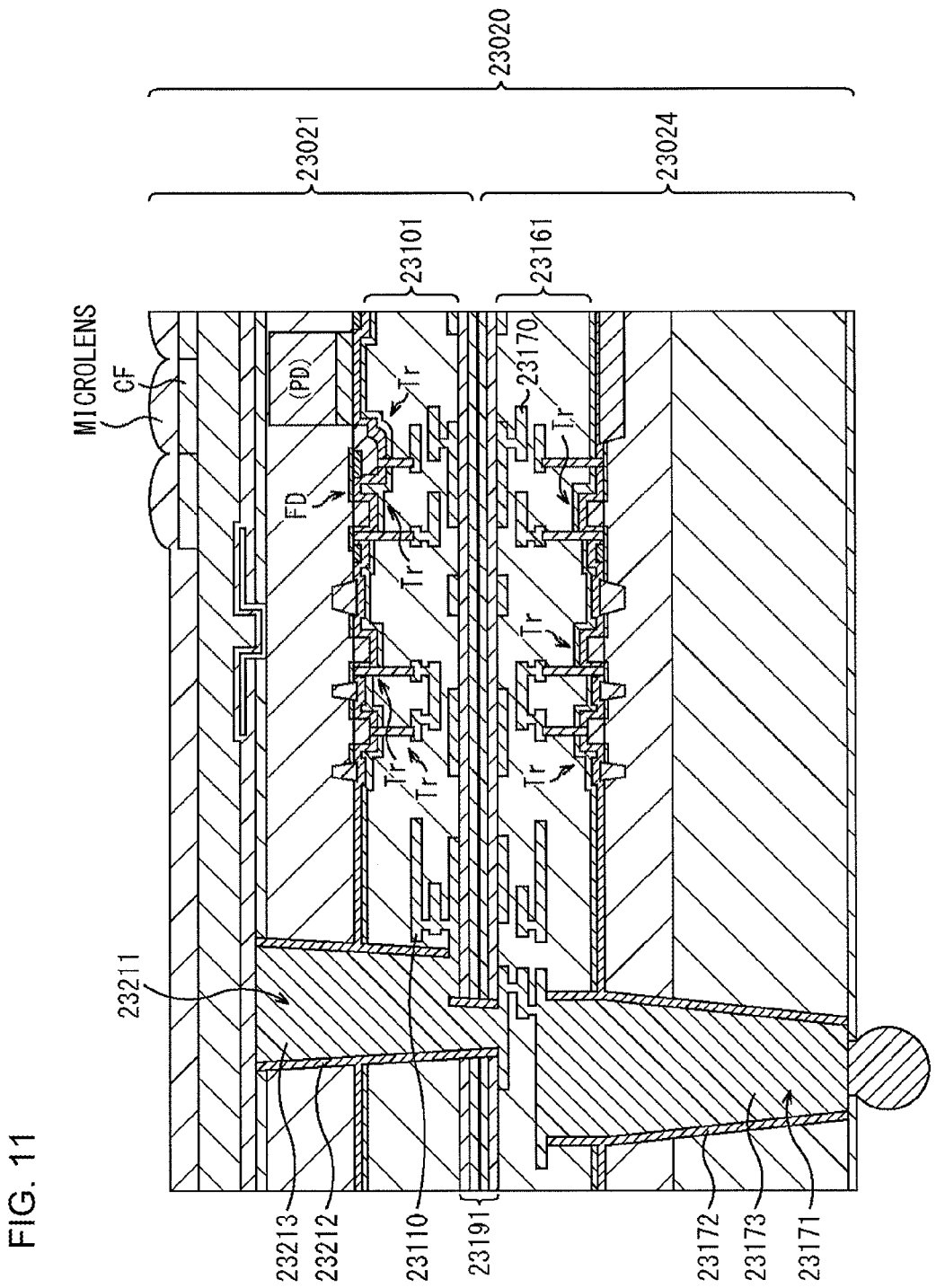
FIG. 11 is a cross-sectional view of a second configuration example of the stacked solid-state imaging apparatus 23020.

FIG. 11 is a cross-sectional view of a second configuration example of the stacked solid-state imaging apparatus 23020.

In the second configuration example of the solid-state imaging apparatus 23020, one contact hole 23211 formed in the sensor die 23021 electrically couples ((the wiring lines 23110 of) the wiring line layer 23101 of) the sensor die 23021 and ((the wiring lines 23170 of) the wiring line layer 23161 of) the logic die 23024 to each other.

That is, in FIG. 11, the contact hole 23211 is formed to penetrate the sensor die 23021 from the back surface side of the sensor die 23021, and reach the wiring line 23170 in the uppermost layer of the logic die 23024 and also reach the wiring line 23110 in the uppermost layer of the sensor die 23021. An insulating film 23212 is formed on an inner wall surface of the contact hole 23211, and an interconnecting conductor 23213 is embedded in the contact hole 23211. The sensor die 23021 and the logic die 23024 are electrically coupled to each other by the two contact holes 23111 and 23121 in FIG. 10 described above, but the sensor die 23021 and the logic die 23024 are electrically coupled to each other by the one contact hole 23211 in FIG. 11.

Figure 12:
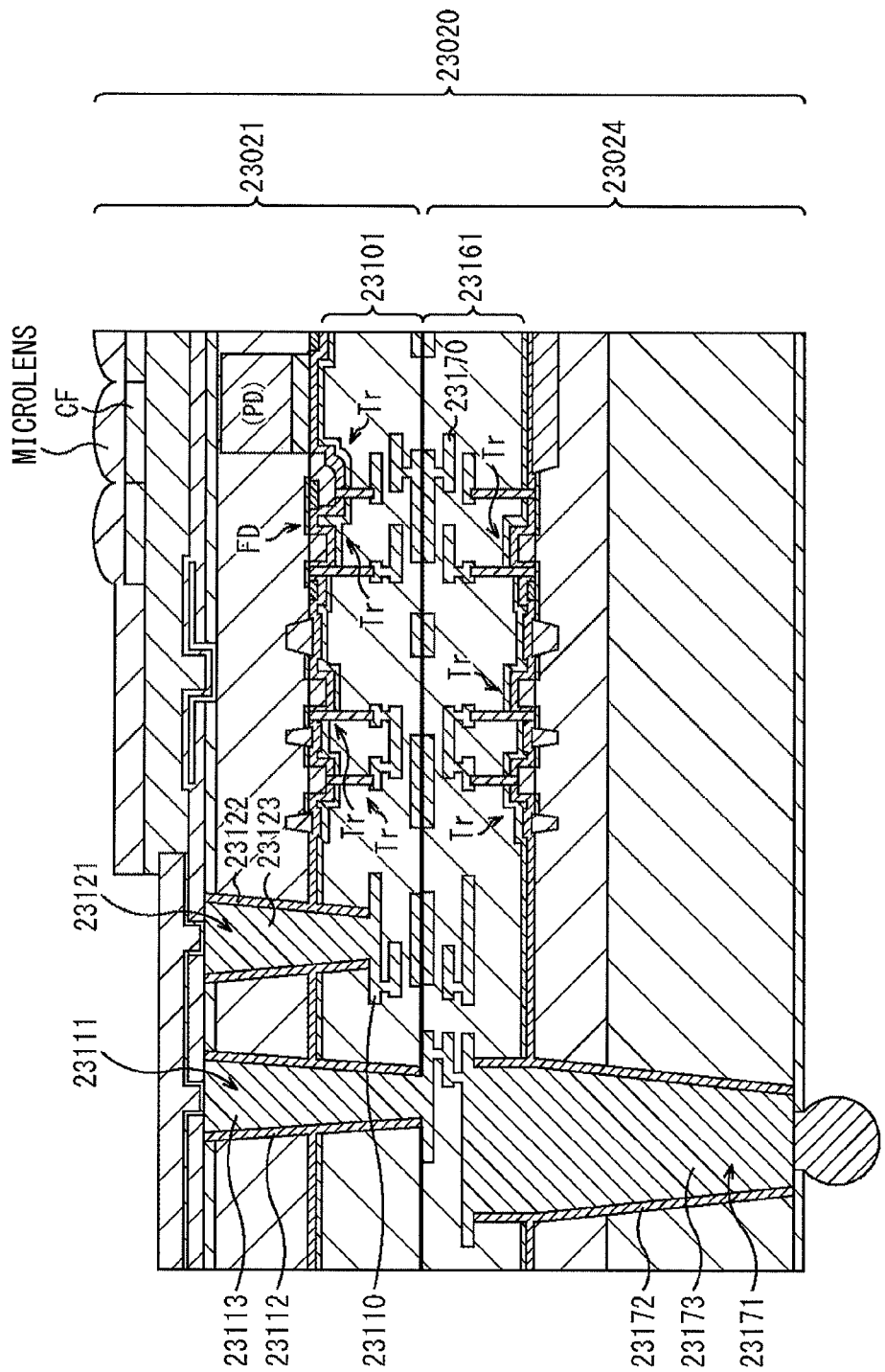
FIG. 12 is a cross-sectional view of a third configuration example of the stacked solid-state imaging apparatus 23020.

FIG. 12 is a cross-sectional view of a third configuration example of the stacked solid-state imaging apparatus 23020.

The solid-state imaging apparatus 23020 in FIG. 12 is different from the case in FIG. 10 in that the film 23191 such as a protective film is not formed on the bonding surface between the sensor die 23021 and the logic die 23024. In the case of FIG. 10, the film 23191 such as a protective film is formed on the bonding surface between the sensor die 23021 and the logic die 23024.

The solid-state imaging apparatus 23020 in FIG. 12 is formed by stacking the sensor die 23021 and the logic die 23024 to bring the wiring lines 23110 and 23170 into direct contact with each other, and applying specific load and heat thereto to directly, join the wiring lines 23110 and 23170 together.

Figure 13:
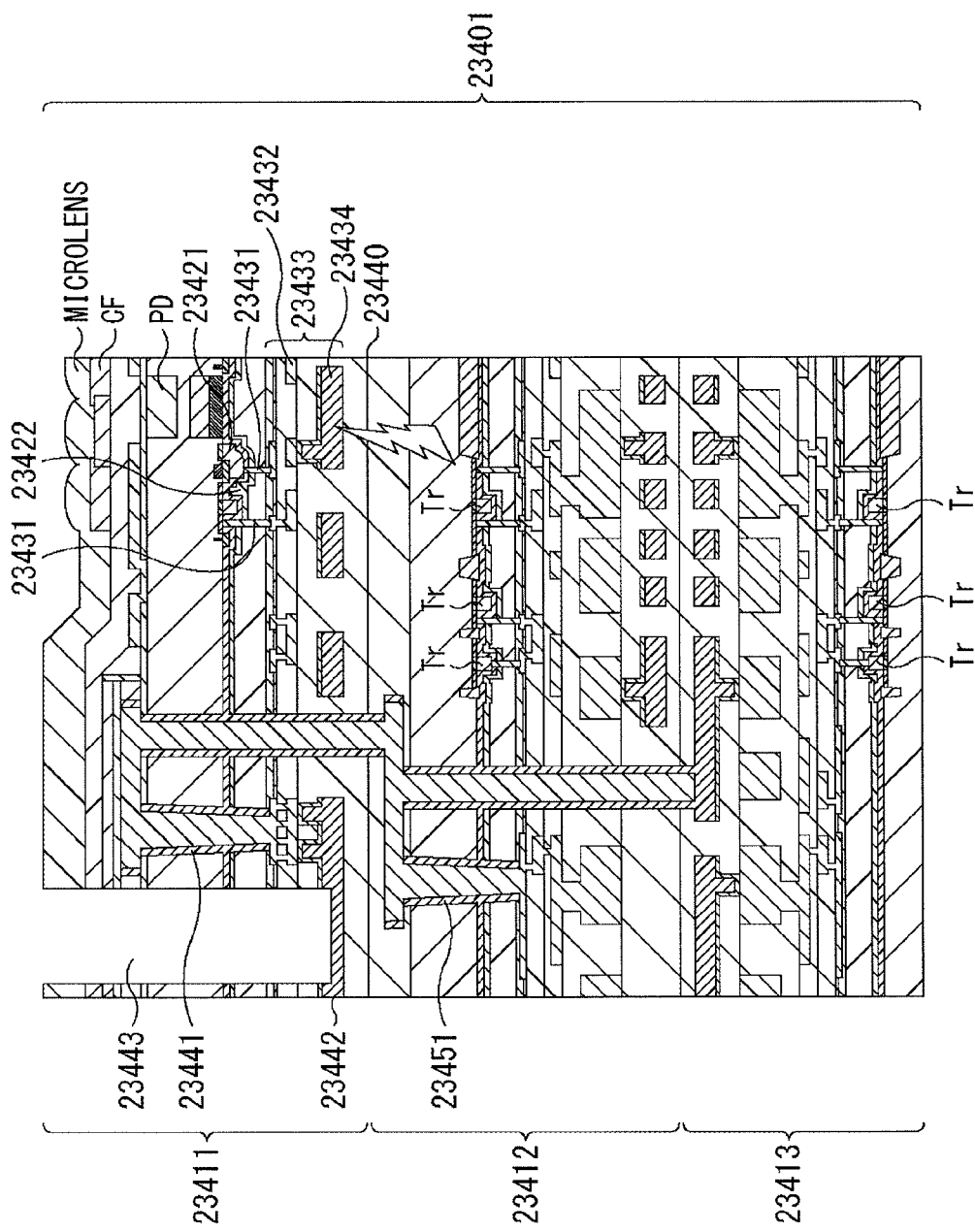
FIG. 13 is a cross-sectional view of another configuration example of the stacked solid-state imaging apparatus that is applicable as the light receiving sensor in the imaging apparatus illustrated in FIG. 1.

FIG. 13 is a cross-sectional view of another configuration example of a stacked solid-state imaging apparatus that is applicable as the light receiving sensor 11.

In FIG. 13, a solid-state imaging apparatus 23401 has a three-layer stacked structure including three stacked dies including a sensor die 23411, a logic die 23412, and a memory die 23413.

The memory die 23413 has a memory circuit that stores data temporarily necessary, for example, in signal processing performed in the logic die 23412.

Figure 20:
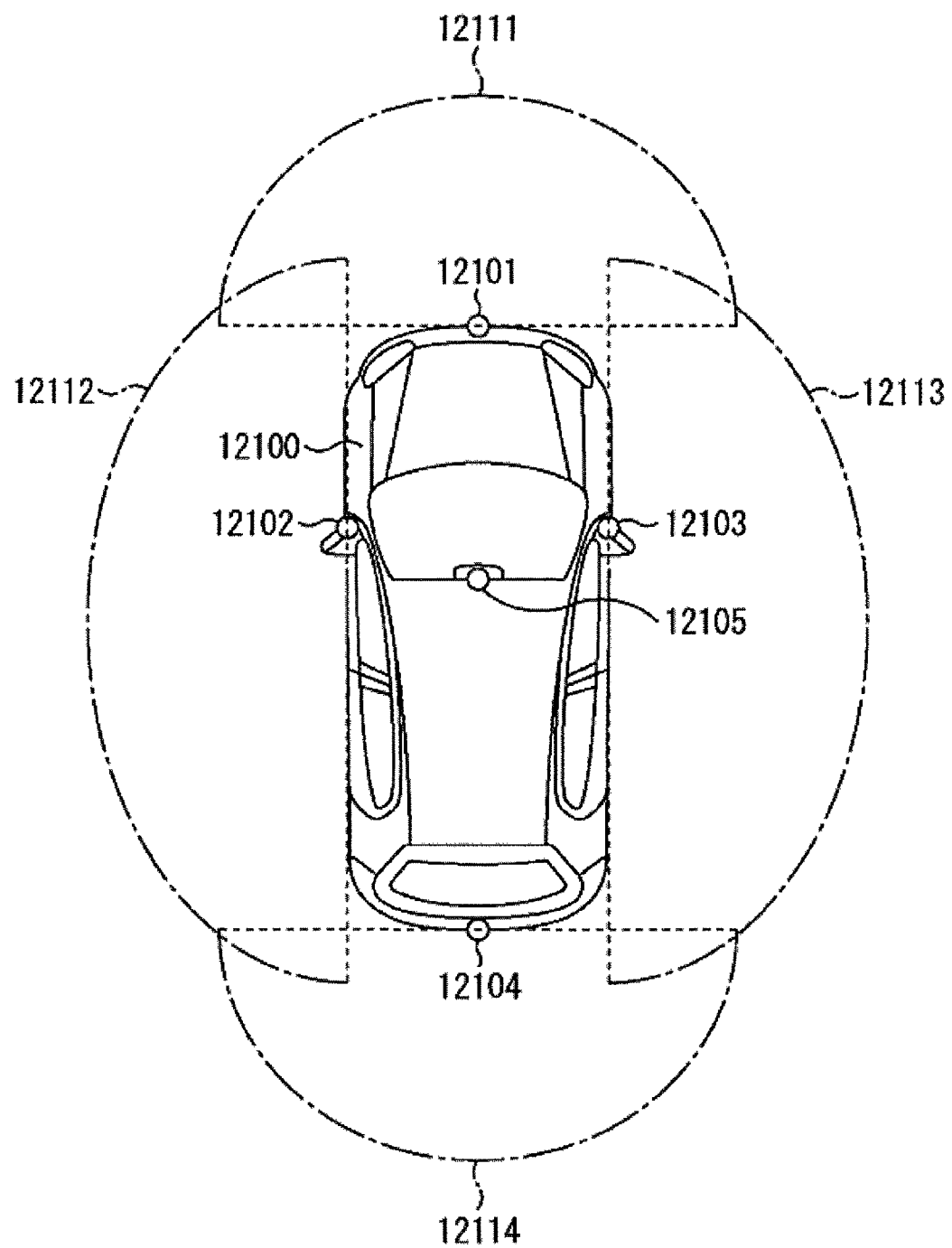
FIG. 20 is a diagram of assistance in explaining an example of installation positions of an outside-vehicle information detecting section and an imaging section.

In FIG. 13, In FIG. 20, the logic die 23412 and the memory die 23413 are stacked under the sensor die 23411 in this order, but it is possible to stack the logic die 23412 and the memory die 23413 under the sensor die 23411 in the inverse order, that is, in the order of the memory die 23413 and the logic die 23412.

It is to be noted that, in FIG. 13, a PD serving as a photoelectric conversion section of a pixel, and a source/drain region of a pixel Tr are formed in the sensor die 23411.

A gate electrode is disposed around the PD with a gate insulating film in between, and the gate electrode and the paired source/drain regions form a pixel Tr 23421 and a pixel Tr 23422.

The pixel Tr 23421 adjacent to the PD is a transfer Tr, and one of the paired the source/drain regions included in the pixel Tr 23421 is an FD.

Further, an interlayer insulating film is formed in the sensor die 23411, and contact holes are formed in the interlayer insulating film. Interconnecting conductors 23431 coupled to the pixel Tr 23421 and the pixel Tr 23422 are formed in the contact holes.

Further, a wiring line layer 23433 having a multilayer wiring line 23432 coupled to each of the interconnecting conductors 23431 is formed in the sensor die 23411.

In addition, an aluminum pad 23434 serving as an electrode for external coupling is formed in a lowermost layer of the wiring line layer 23433 in the sensor die 23411. That is, the aluminum pad 23434 is formed closer to a bonding surface 23440 with the logic die 23412 than the wiring line 23432 in the sensor die 23411. The aluminum pad 23434 is used as one end of a wiring line engaged in input and output of signals to and from the outside.

Further, a contact 23441 is formed in the sensor die 23411. The contact 23441 is used for electrical coupling to the logic die 23412. The contact 23441 is coupled to a contact 23451 in the logic die 23412 and is also coupled to an aluminum pad 23442 in the sensor die 23411.

A pad hole 23443 is then formed in the sensor die 23411 to reach the aluminum pad 23442 from a back surface side (upper side) of the sensor die 23411.

The configurations of the solid-state imaging apparatus as described above are applicable to the light receiving sensor 11.

5. EXAMPLE OF APPLICATION TO ELECTRONIC APPARATUS

The technology according to the present disclosure is not limited to application to an imaging element. That is, the technology according to the present disclosure is applicable to general electronic apparatuses that use the imaging element for an image capturing section (a photoelectric conversion section), including imaging apparatuses such as digital still cameras and video cameras, mobile terminals having an imaging function, copiers that use the imaging element for an image reading section, and the like. The imaging element may be in one-chip form or in a module form having an imaging function achieved by packing an imaging section and a signal processing section or an optical system together.

Figure 14:
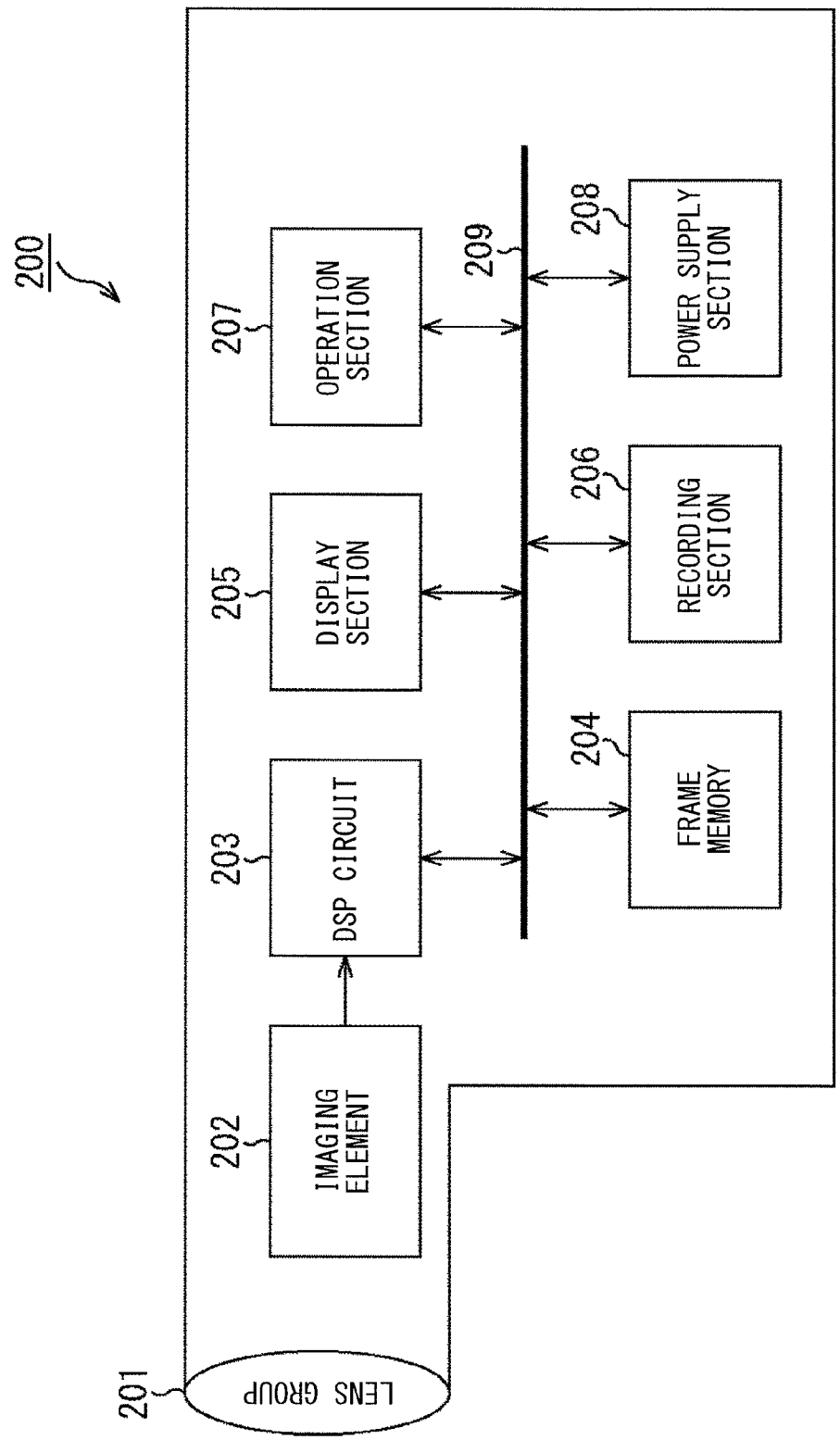
FIG. 14 is a block diagram illustrating a configuration example of an imaging apparatus as an electric apparatus to which the technology according to the present disclosure is applied.

FIG. 14 is a block diagram illustrating a configuration example of an imaging apparatus as an electronic apparatus to which the technology according to the present disclosure is applied.

An imaging apparatus 200 in FIG. 14 includes an optical section 201 including a lens group and the like, an imaging element (an imaging device) 202 adopting the configuration of the imaging element 1 in FIG. 1, and a DSP (Digital Signal Processor) circuit 203 that is a camera signal processing circuit. Further, the imaging apparatus 200 also includes a frame memory 204, a display section 205, a recording section 206, an operation section 207, and a power source 208. The DSP circuit 203, the frame memory 204, the display section 205, the recording section 206, the operation section 207, and the power source 208 are coupled to one another through a bass line 209.

The optical section 201 captures incoming Light (image light) from a subject and forms an image on an imaging plane of the imaging element 202. The imaging element 202 converts the amount of the incoming light for image formation on the imaging plane by the optical section 201 into an electric signal in units of pixels and outputs the electric signal as a pixel signal. As the imaging element 202, it is possible to use the imaging element 1 in FIG. 1, that is, the imaging element 1 that suppresses generation of a void by providing the frame 13 between the light receiving sensor 11 and the cover glass 15, and filling an inner side in a planer direction of the frame 13 with the IRCF layer 14.

The display section 205 includes, for example, a thin display such as an LCD (Liquid Crystal Display) and an organic EL (Electro Luminescence) display, and displays a moving image or a still image captured by the imaging element 202. The recording section 206 records the moving image or the still image captured by the imaging element 202 on a recording medium such as a hard disk or a semiconductor memory.

The operation section 207 is operated by a user to issue operation instructions for various functions of the imaging apparatus 200. The power source 208 supplies the DSP circuit 203, the frame memory 204, the display section 205, the recording section 206, and the operation section 207 with various types of power for operating these targets as appropriate.

As described above, the use of the above-described imaging element 1 as the imaging element 202 makes it possible to suppress occurrence of deterioration in the optical characteristics and any image defect. Thus, even in the imaging apparatus 200 such as a video camera and a digital still camera, and further a camera module for a mobile device such as a mobile phone, it is possible to generate an image having high image quality while achieving miniaturization.

6. USAGE EXAMPLES OF IMAGE SENSOR

Figure 15:
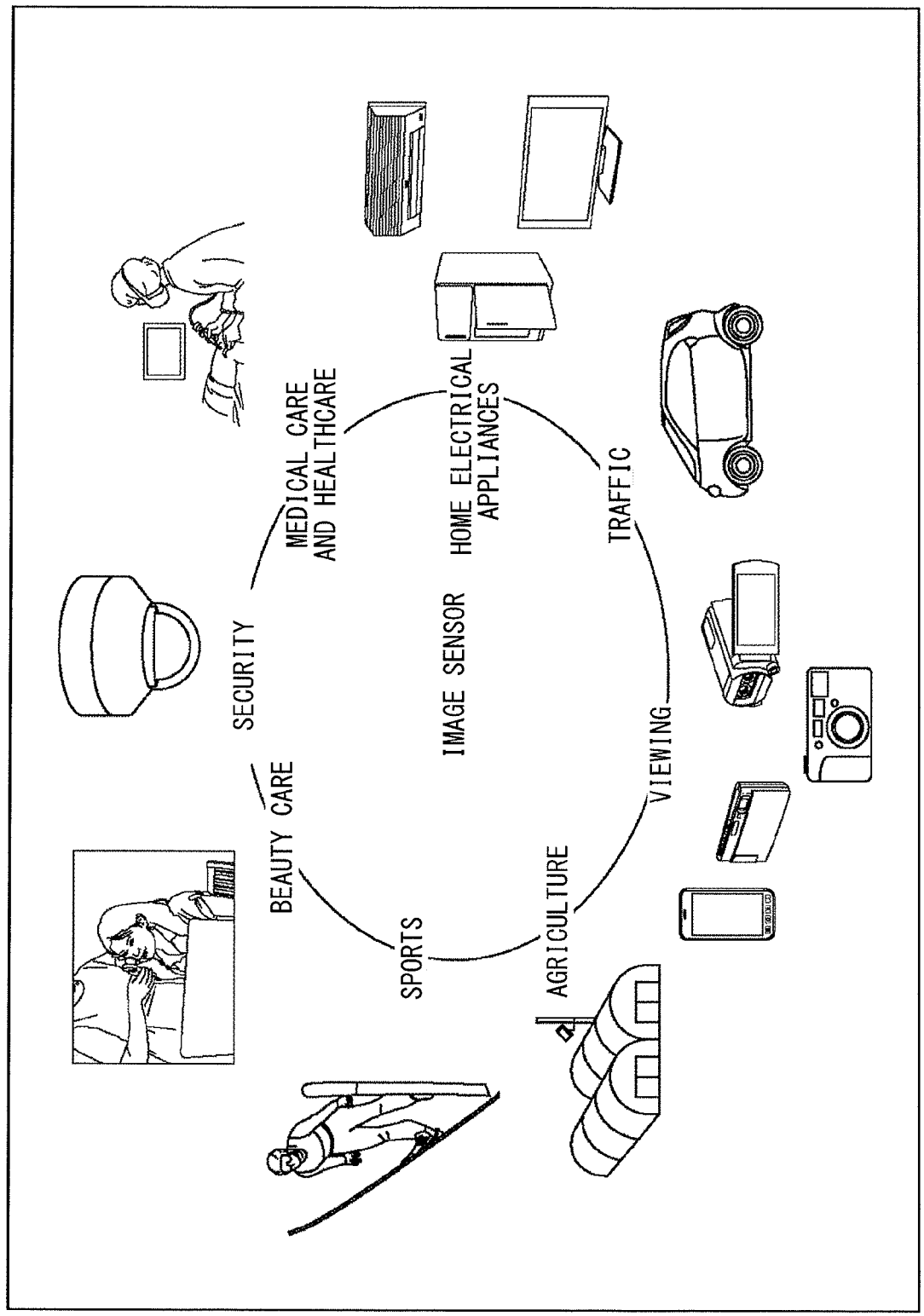
FIG. 15 is a diagram for describing usage examples of an image sensor.

FIG. 15 is a diagram illustrating usage examples of examples of the above-described imaging element 1 as an image sensor.

The image sensor using the above-described imaging element 1 is usable, for example, in the following various cases in which light such as visible light, infrared light, ultraviolet light, and X-rays is sensed.

- Apparatuses that shoot images for viewing such as digital cameras and mobile devices having a camera function
- Apparatuses for traffic use such as onboard sensors that shoot images of the front, back, surroundings, inside, and so on of an automobile for safe driving such as automatic stop and for recognition of driver's state, monitoring cameras that monitor traveling vehicles and roads, and distance measuring sensors that measure a distance between vehicles or the like.
- Apparatuses for use in home electrical appliances such as televisions, refrigerators, and air-conditioners to shoot images of a user's gesture and operate the appliances in accordance with the gesture
- Apparatuses for medical care and healthcare use such as endoscopes and apparatuses that shoot images of blood vessels by receiving infrared light
- Apparatuses for security use such as monitoring cameras for crime prevention and cameras for individual authentication
- Apparatuses for beauty care use such as skin measuring devices that shoot images of skin and microscopes that shoot images of scalp
- Apparatuses for sports use such as action cameras and wearable cameras for sports applications
- Apparatuses for agricultural use such as cameras for monitoring fields and crops

7. EXAMPLE OF APPLICATION TO IN-VIVO INFORMATION ACQUISITION SYSTEM

The technology (present technology) according to the present disclosure is applicable to various products as described above. For example, the technology according to the present disclosure may be applied to an in-vivo information acquisition system of a patient using a capsule type endoscope.

Figure 16:
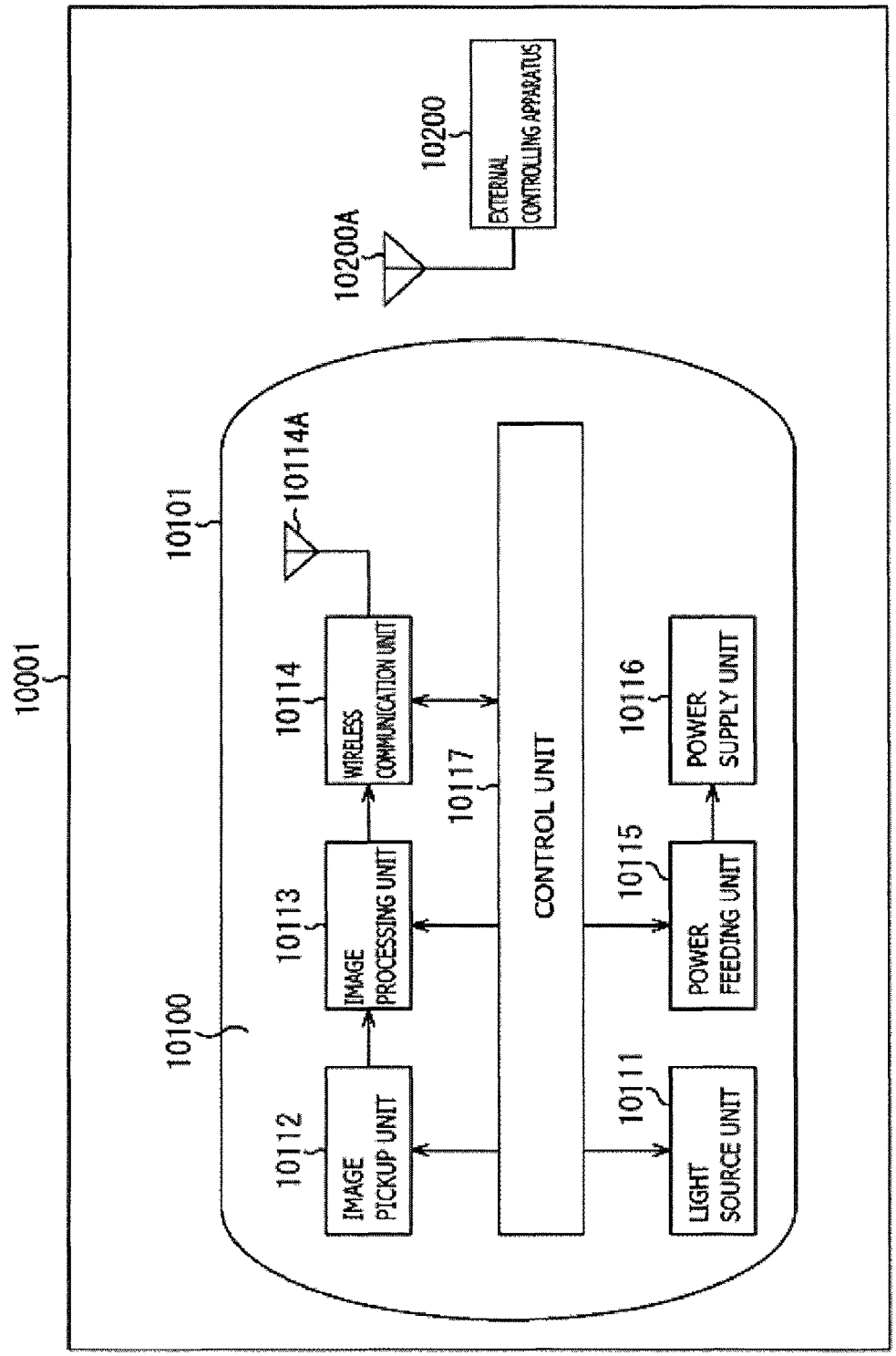
FIG. 16 is a block diagram depicting an example of a schematic configuration of an in-vivo information acquisition system.

FIG. 16 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 16, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of the in-vivo information acquisition system to which the technology according to the present disclosure may be applied has been described above. The technology according to the present disclosure may be applied to the image pickup unit 10112 among the components described above. Specifically, the imaging element 1 described above is applicable as the image pickup unit 10112. Applying the technology according to the present disclosure to the image pickup unit 10112 allows the capsule type endoscope 10100 to be more miniaturized. This makes it possible to further reduce the burden on a patient. In addition, it is possible to acquire an image having high image quality while miniaturizing the capsule type endoscope 10100.

8. EXAMPLE OF APPLICATION TO ENDOSCOPIC SURGERY SYSTEM

For example, the technology according to the present disclosure may be applied to an endoscopic surgery system.

Figure 17:
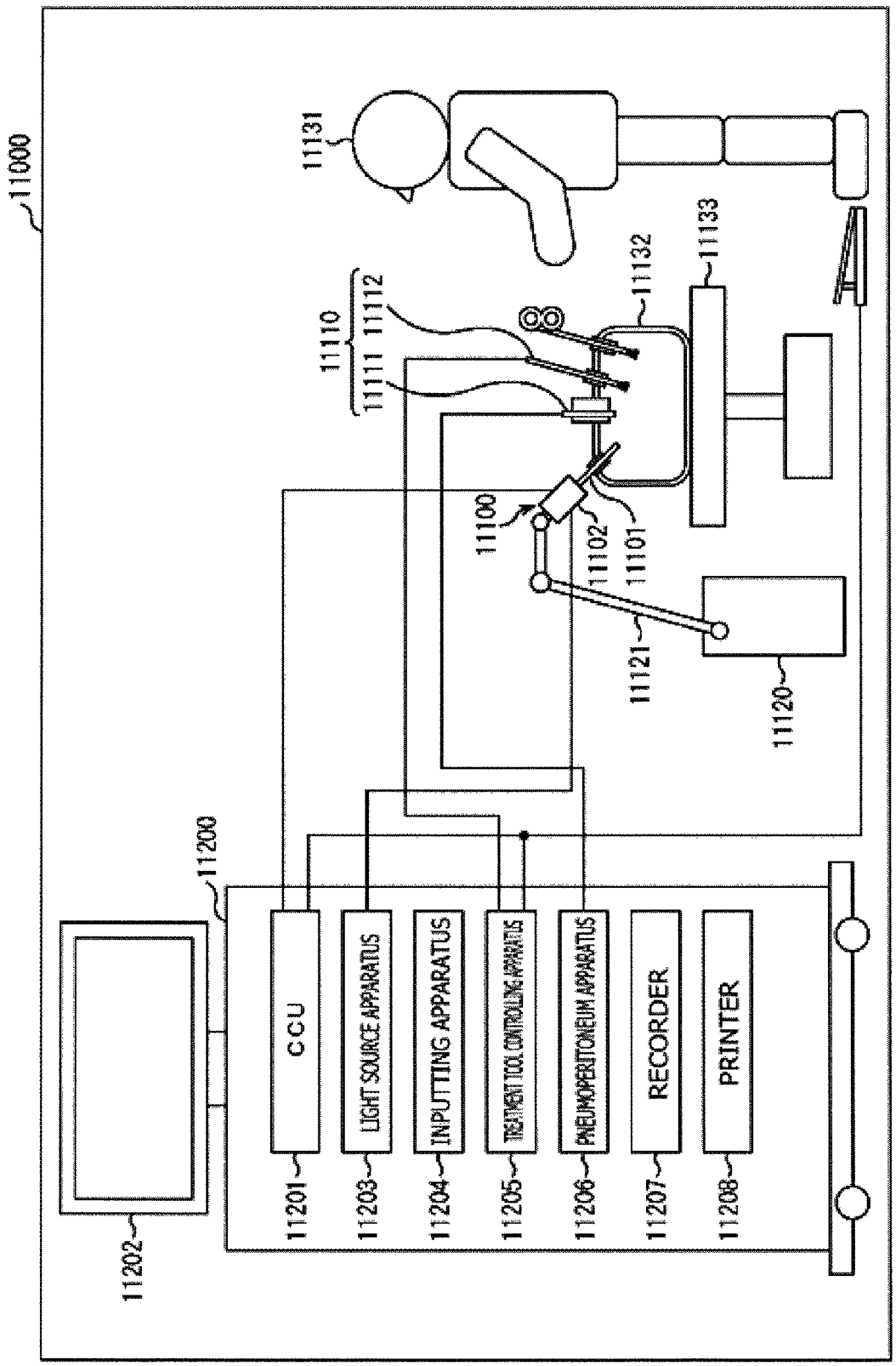
FIG. 17 is a view depicting an example of a schematic configuration of an endoscopic surgery system.

FIG. 17 is a view depicting an example of a schematic configuration of an endoscopic surgery system to which the technology according to an embodiment of the present disclosure (present technology) can be applied.

In FIG. 17, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 18:
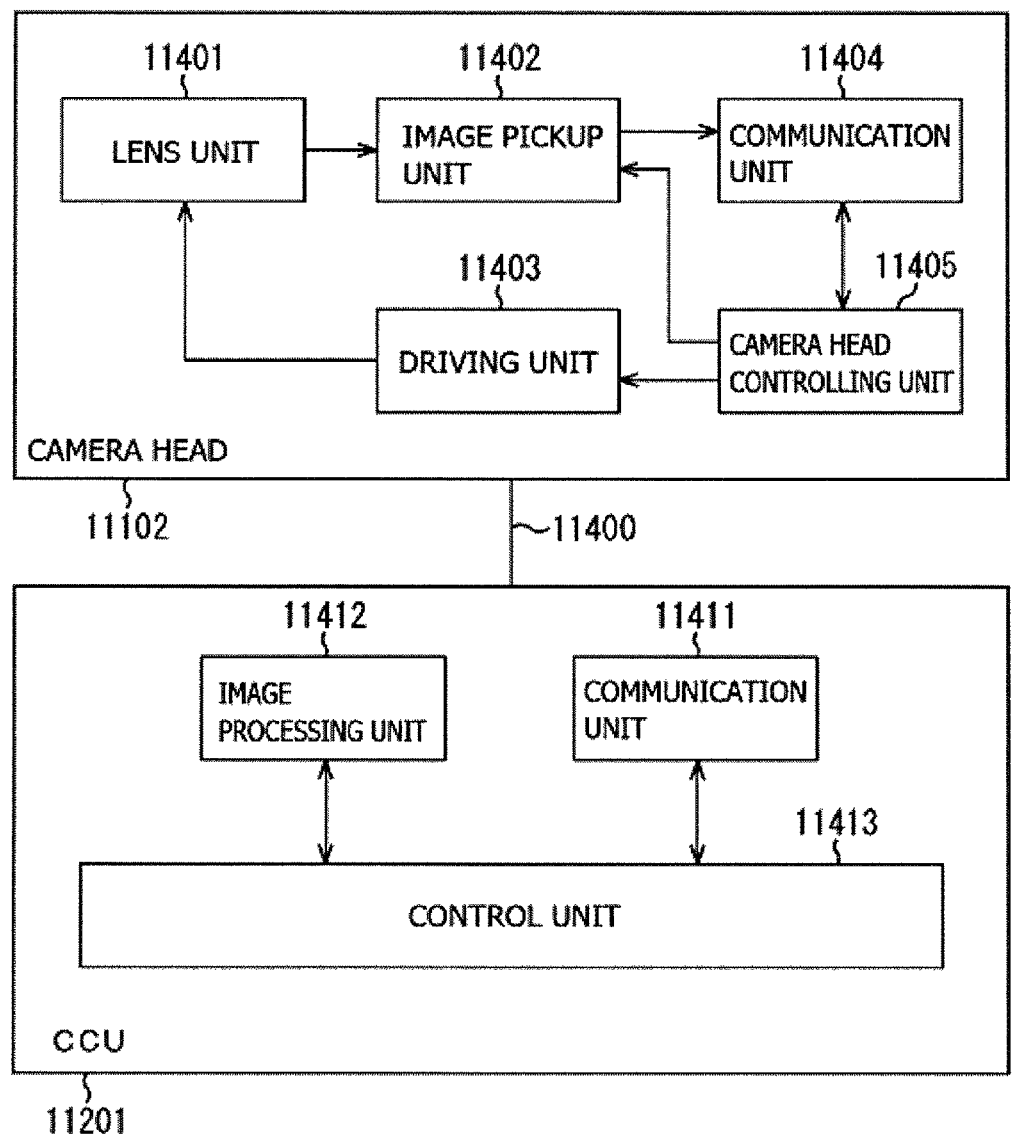
FIG. 18 is a block diagram depicting an example of a functional configuration of a camera head and a camera control unit (CCU).

FIG. 18 is a block diagram depicting an example of a functional configuration of the camera head 11102 and the CCU 11201 depicted in FIG. 17.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure may be applied has been described above. The technology according to the present disclosure may be applied to, for example, the image pickup unit 11402 of the camera head 11102 among the components described above. Specifically, the imaging element 1 described above is applicable as the image pickup unit 11402. Applying the technology according to the present disclosure to the image pickup unit 11402 makes it possible to acquire an image having high image quality while miniaturizing the camera head 11102.

It is noted that the endoscopic surgery system has been described here as an example, but the technology according to the present disclosure may be additionally applied to, for example, a microscopic surgery system or the like.

9. EXAMPLE OF APPLICATION TO MOBILE BODY

Further, for example, the technology according to the present disclosure may be achieved as an apparatus mounted on any type of mobile body such as an automobile, an electric vehicle, a hybrid electric vehicle, a motorcycle, a bicycle, a personal mobility, an airplane, a drone, a vessel, or a robot.

Figure 19:
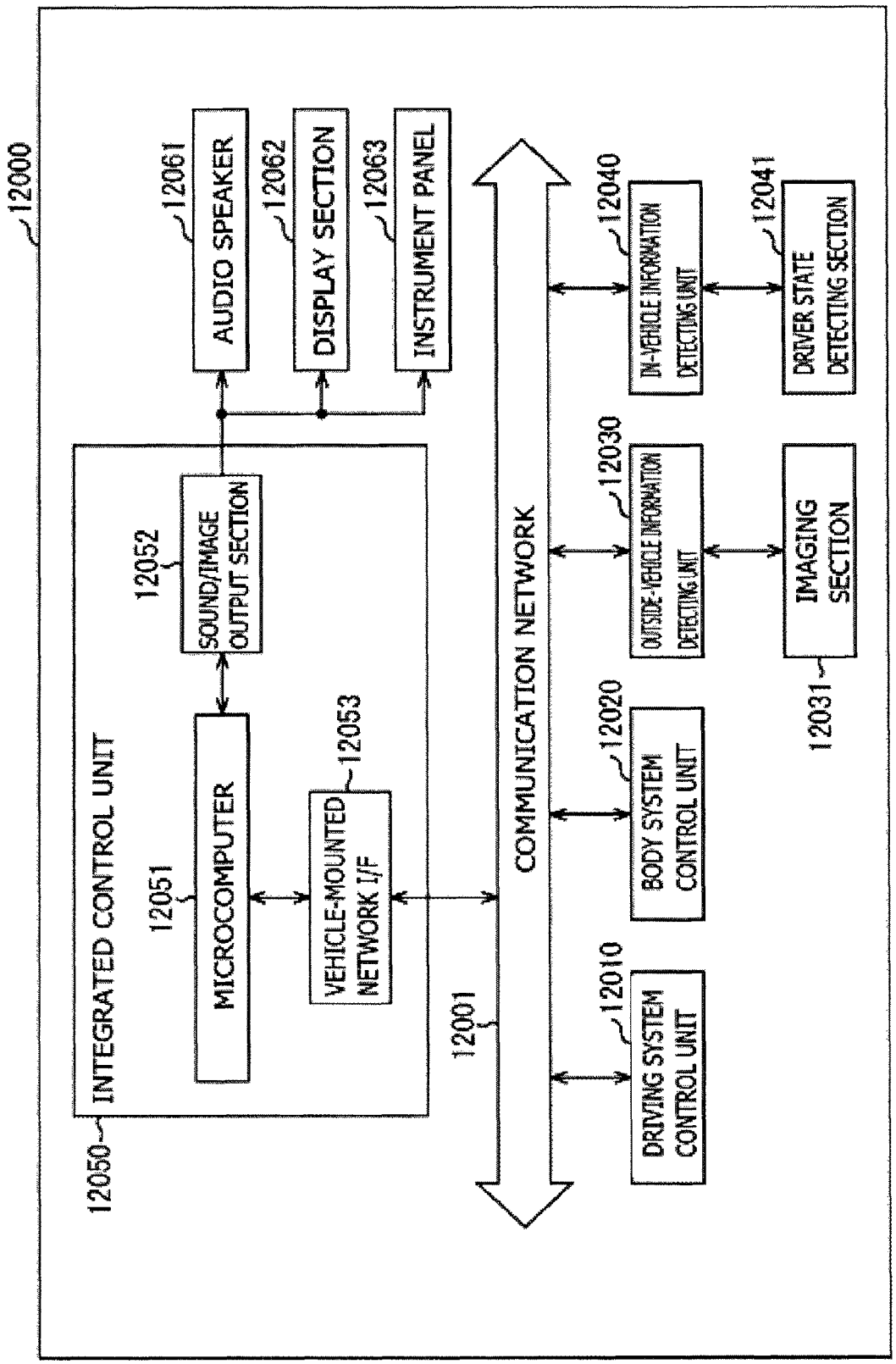
FIG. 19 is a block diagram depicting an example of schematic configuration of a vehicle control system.

FIG. 19 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 19, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (L/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 19, an audio speaker 12061, a display section 12062, and an instrument panel 12063 are illustrated as the output device. The display section 12062 may, for example, include at least one of an on-board display and a head-up display.

FIG. 20 is a diagram depicting an example of the installation position of the imaging section 12031.

In FIG. 20, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview minors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 20 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview minors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure may be applied has been described above. The technology according to the present disclosure may be applied to the imaging section 12031 among the components described above. Specifically, the imaging element 1 described above is applicable as the imaging section 12031. Applying the technology according to the present disclosure to the imaging section 12031 makes it possible to acquire an image having high image quality while achieving miniaturization.

An embodiment of the present technology is not limited to the above-described embodiment, but various modifications may be made without departing from the scope of the present technology.

For example, it is possible to adopt a combination of all or a portion of the plurality of embodiments described above.

Further, the present technology is applicable not only to solid-state imaging apparatuses, but also to general semiconductor apparatuses that have other semiconductor integrated circuits.

It is to be noted that the present technology may be configured as follows.

(1)

An imaging element including:

a light receiving sensor that performs photoelectric conversion of incoming light;

a protective substrate that protects a top surface side serving as a light incidence surface of the light receiving sensor;

a frame that is disposed in an outer peripheral portion between the light receiving sensor and the protective substrate, and is formed with use of an inorganic material; and an infrared cutoff filter layer that is formed on an inner side on a same plane as the frame.

(2)

The imaging element according to (1), in which the frame and the infrared cutoff filter layer that are formed on the same plane are bonded to a planarizing film over an entire opposed region by an adhesive agent, the planarizing film being formed in an uppermost portion of the light receiving sensor.

(3)

The imaging element according to (1) or (2), further including a low-reflection film at a predetermined position between a planarizing film and the protective substrate, the planarizing film being formed in an uppermost portion of the light receiving sensor.

(4)

The imaging element according to (3), in which the low-reflection film is formed between the frame and the infrared cutoff filter layer that are formed on the same plane and the light receiving sensor.

(5)

The imaging element according to (3), in which the low-reflection film is formed between the frame and the infrared cutoff filter layer that are formed on the same plane and the protective substrate.

(6)

The imaging element according to (3), in which the low-reflection film is formed between the frame and the light receiving sensor and between the infrared cutoff filter layer and the protective substrate.

(7)

The imaging element according to (3), in which the low-reflection film has at least two layers of a first low-reflection film and a second low-reflection film, the first low-reflection film is formed between the frame and the infrared cutoff filter layer that are formed on the same plane and the protective substrate, and the second low-reflection film is formed between the frame and the light receiving sensor and between the infrared cutoff filter layer and the protective substrate.

(8)

The imaging element according to any one of (1) to (7), in which the frame is formed with use of glass.

(9)

The imaging element according to any one of (1) to (7), in which the frame is formed with use of silicon.

(10)

A method of manufacturing an imaging element, the method including: forming a frame at a position of an outer peripheral portion of a light receiving sensor on a protective substrate that protects the light receiving sensor, the frame being formed with use of an inorganic material;

forming an infrared cutoff filter layer on an inner side on a same plane as the frame; and bonding the frame and the infrared cutoff filter layer that are formed on the same plane to the light receiving sensor by an adhesive agent.

(11)

The method of manufacturing the imaging element according to (10), in which the frame is formed by forming a through-hole in a substrate formed with use of an inorganic material, and the substrate in which the frame is formed and the protective substrate are bonded to each other, thereby forming the frame on the protective substrate.

(12)

The method of manufacturing the imaging element according to (10), in which the frame is formed on the protective substrate by etching a region in which the infrared cutoff filter layer is formed of a substrate formed with use of an inorganic material to a desired thickness.

(13)

The method of manufacturing the imaging element according to any one of (10) to (12), further including forming a low-reflection film at a predetermined position between a planarizing film and the protective substrate, the planarizing film being formed in an uppermost portion of the light receiving sensor.

(14)

The method of manufacturing the imaging element according to any one of (10) to (13), in which processes until the bonding by the adhesive agent are performed in a wafer state, and thereafter dicing in a chip size is performed.

(15)

An electronic apparatus provided with an imaging element, the imaging element including:

a light receiving sensor that performs photoelectric conversion of incoming light;

a protective substrate that protects a top surface side serving as a light incidence surface of the light receiving sensor;

a frame that is disposed in an outer peripheral portion between the light receiving sensor and the protective substrate, and is formed with use of an inorganic material;

and an infrared cutoff filter layer that is formed on an inner side on a same plane as the frame.

REFERENCE NUMERAL LIST

1: imaging element
11: light receiving sensor
12: adhesive agent
13: frame
14: infrared cutoff filter layer (IRCF layer)

15: cover glass
24: planarizing film
41: through-hole
61 (61A and 61B): low-reflection film
200: imaging apparatus
202: imaging element

What is claimed is:

1. An imaging element comprising:
   a light receiving sensor that performs photoelectric conversion of incoming light;
   a protective substrate that protects a top surface side serving as a light-incident surface of the light receiving sensor;
   a planarizing film covering an entire surface of the light receiving sensor;
   a frame that is disposed in an outer peripheral portion between the light receiving sensor and the protective substrate, and is formed with use of an inorganic material; and
   an infrared cutoff filter layer that is formed on an inner side on a same plane as the frame, wherein a thickness of the infrared cutoff filter layer and a thickness of the frame are the same.

2. The imaging element according to claim 1, wherein the frame and the infrared cutoff filter layer that are formed on the same plane are bonded to the planarizing film over an entire opposed region by an adhesive agent, the planarizing film being formed in an uppermost portion of the light receiving sensor.

3. The imaging element according to claim 1, further comprising a low-reflection film at a predetermined position between the planarizing film and the protective substrate, the planarizing film being formed in an uppermost portion of the light receiving sensor.

4. The imaging element according to claim 3, wherein the low-reflection film is formed between the frame and the infrared cutoff filter layer that are formed on the same plane and the light receiving sensor.

5. The imaging element according to claim 3, wherein the low-reflection film is formed between the frame and the infrared cutoff filter layer that are formed on the same plane and the protective substrate.

6. The imaging element according to claim 3, wherein the low-reflection film is formed between the frame and the light receiving sensor and between the infrared cutoff filter layer and the protective substrate.

7. The imaging element according to claim 3, wherein the low-reflection film has at least two layers comprising at least a first low-reflection film and a second low-reflection film,
   the first low-reflection film is formed between the frame and the infrared cutoff filter layer that are formed on the same plane and the protective substrate, and
   the second low-reflection film is formed between the frame and the light receiving sensor and between the infrared cutoff filter layer and the protective substrate.

8. The imaging element according to claim 1, wherein the frame is formed with use of glass.

9. The imaging element according to claim 1, wherein the frame is formed with use of silicon.

10. A method of manufacturing an imaging element, the method comprising:
    forming a frame at a position of an outer peripheral portion of a light receiving sensor on a protective substrate that protects the light receiving sensor, the frame being formed with use of an inorganic material;
    forming a planarizing film that covers an entire surface of the light receiving sensor;
    forming an infrared cutoff filter layer on an inner side on a same plane as the frame; and
    bonding the frame and the infrared cutoff filter layer that are formed on the same plane to the light receiving sensor by an adhesive agent, wherein a thickness of the infrared cutoff filter layer and a thickness of the frame are the same.

11. The method of manufacturing the imaging element according to claim 10, wherein the frame is formed by forming a through-hole in a substrate formed with use of the inorganic material, and the substrate in which the frame is formed and the protective substrate are bonded to each other, thereby forming the frame on the protective substrate.

12. The method of manufacturing the imaging element according to claim 10, wherein the frame is formed on the protective substrate by etching a region in which the infrared cutoff filter layer is formed of a substrate formed with use of the inorganic material to a desired thickness.

13. The method of manufacturing the imaging element according to claim 10, further comprising forming a low-reflection film at a predetermined position between the planarizing film and the protective substrate, the planarizing film being formed in an uppermost portion of the light receiving sensor.

14. The method of manufacturing the imaging element according to claim 10, wherein processes until the bonding by the adhesive agent are performed in a wafer state, and thereafter dicing in a chip size is performed.

15. An electronic apparatus provided with an imaging element, the imaging element comprising:
    a light receiving sensor that performs photoelectric conversion of incoming light;
    a protective substrate that protects a top surface side serving as a light-incident surface of the light receiving sensor;
    a planarizing film covering an entire surface of the light receiving sensor;
    a frame that is disposed in an outer peripheral portion between the light receiving sensor and the protective substrate, and is formed with use of an inorganic material; and
    an infrared cutoff filter layer that is formed on an inner side on a same plane as the frame, wherein a thickness of the infrared cutoff filter layer and a thickness of the frame are the same.

* * * * *